US012648462B2

(12) United States Patent
Kwon et al.

(10) Patent No.: US 12,648,462 B2
(45) Date of Patent: Jun. 2, 2026

(54) CIRCUIT BOARD AND SEMICONDUCTOR PACKAGE COMPRISING SAME

(71) Applicant: LG INNOTEK CO., LTD., Seoul (KR)

(72) Inventors: Myung Jae Kwon, Seoul (KR); Sang Hyuck Nam, Seoul (KR); Ki Su Yeo, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 178 days.

(21) Appl. No.: 18/293,165

(22) PCT Filed: Jul. 29, 2022

(86) PCT No.: PCT/KR2022/011238
§ 371 (c)(1),
(2) Date: Jan. 29, 2024

(87) PCT Pub. No.: WO2023/008965
PCT Pub. Date: Feb. 2, 2023

(65) Prior Publication Data
US 2024/0258223 A1      Aug. 1, 2024

(30) Foreign Application Priority Data

Jul. 29, 2021      (KR) ........................ 10-2021-0100186

(51) Int. Cl.
H10W 70/63          (2026.01)
H10W 70/05          (2026.01)
          (Continued)

(52) U.S. Cl.
CPC ....... H10W 70/635 (2026.01); H10W 70/095 (2026.01); H10W 70/685 (2026.01); *H10W 90/724* (2026.01)

(58) Field of Classification Search
CPC ......... H01L 23/49827; H01L 23/49822; H01L 21/486; H01L 2224/16227
          (Continued)

(56) References Cited

U.S. PATENT DOCUMENTS 5,841,232 A * 11/1998 Hirao ....................... H01J 11/32
                                                  313/632
9,520,333 B1    12/2016 Shih et al.
          (Continued)

FOREIGN PATENT DOCUMENTS

JP          2011-210795 A      10/2011
KR      10-2010-0060406 A       6/2010
          (Continued)

*Primary Examiner* — Andargie M Aychillhum
(74) *Attorney, Agent, or Firm* — Birch, Stewart, Kolasch & Birch, LLP

(57)          ABSTRACT

A circuit board according to an embodiment includes a first insulating layer including an upper and lower surface; a first through electrode passing through the upper and lower surfaces of the first insulating layer; and a first circuit pattern layer disposed on a lower surface of the first insulating layer, wherein the first through electrode includes: a first electrode part disposed adjacent to the lower surface of the first insulating layer and having a first inclination; and a second electrode part disposed adjacent to the upper surface of the first insulating layer and having a second inclination that is different from the first inclination so that a width gradually decreases toward the first upper surface of the first insulating layer, and wherein the first electrode part non-overlaps in a horizontal direction with the first circuit pattern layer.

19 Claims, 16 Drawing Sheets

(51) Int. Cl.
    *H10W 70/685*     (2026.01)
    *H10W 90/00*     (2026.01)

(58) Field of Classification Search
    USPC ........................................................ 174/262
    See application file for complete search history.

(56)              References Cited

U.S. PATENT DOCUMENTS

| | | | |
|---|---|---|---|
| 11,183,462 | B2 | 11/2021 | Hwang et al. |
| 2010/0327422 | A1 | 12/2010 | Lee et al. |
| 2013/0264101 | A1* | 10/2013 | Furuichi ................ H05K 1/115 |
| | | | 174/251 |
| 2014/0034359 | A1 | 2/2014 | Lee et al. |
| 2014/0182919 | A1 | 7/2014 | Kim |
| 2014/0353027 | A1* | 12/2014 | Osaki ..................... H05K 3/427 |
| | | | 174/266 |

| | | | |
|---|---|---|---|
| 2015/0027758 | A1 | 1/2015 | Maeda |
| 2015/0096791 | A1 | 4/2015 | Katsube |
| 2015/0187692 | A1* | 7/2015 | Tseng .................... H01L 23/481 |
| | | | 174/250 |
| 2015/0313018 | A1 | 10/2015 | Maeda |
| 2016/0372395 | A1 | 12/2016 | Shih et al. |
| 2021/0183784 | A1 | 6/2021 | Hwang et al. |

FOREIGN PATENT DOCUMENTS

| | | | | |
|---|---|---|---|---|
| KR | 10-2011-0000960 | A | 1/2011 | |
| KR | 20110000960 | A  * | 1/2011 | .......... H01L 23/481 |
| KR | 10-2014-0018027 | A | 2/2014 | |
| KR | 10-1397303 | B1 | 5/2014 | |
| KR | 10-2014-0147894 | A | 12/2014 | |
| KR | 10-2015-0094719 | A | 8/2015 | |
| KR | 10-2021-0076583 | A | 6/2021 | |

* cited by examiner

【FIG. 1A】
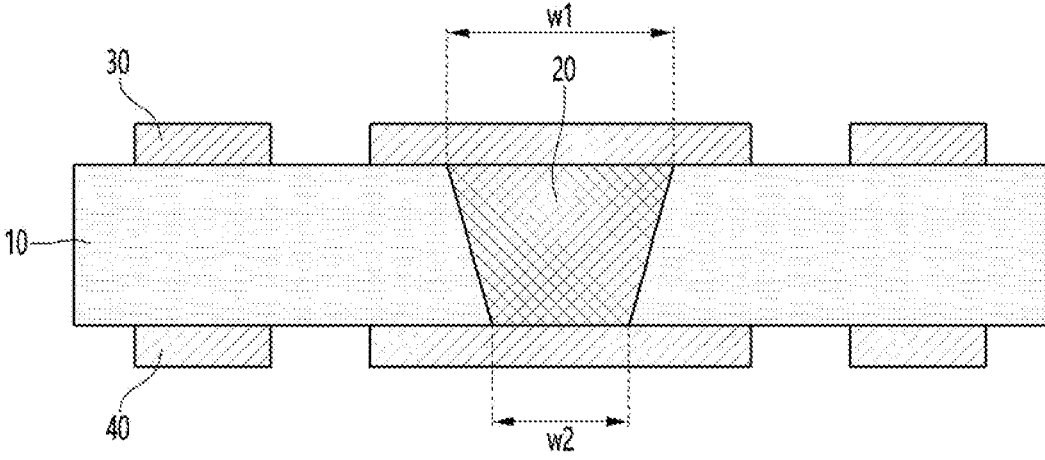
【FIG. 1B】
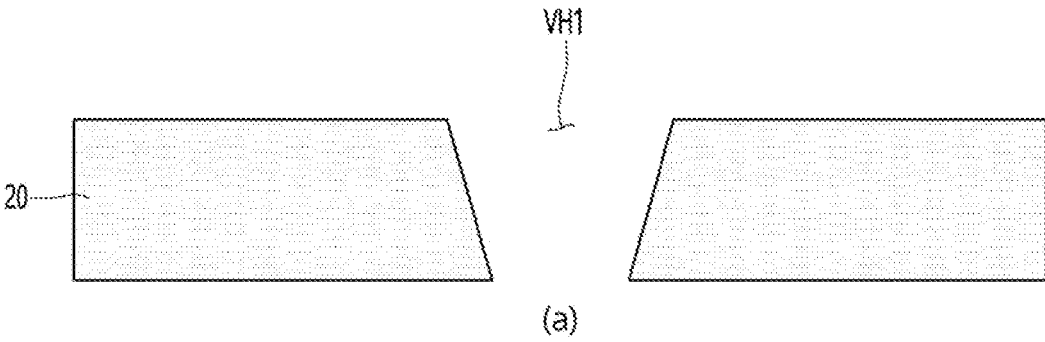
(a)
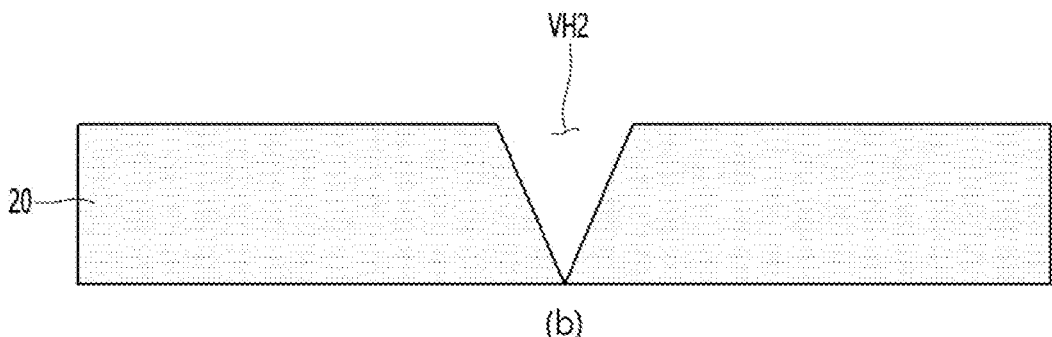
(b)

【FIG. 2A】
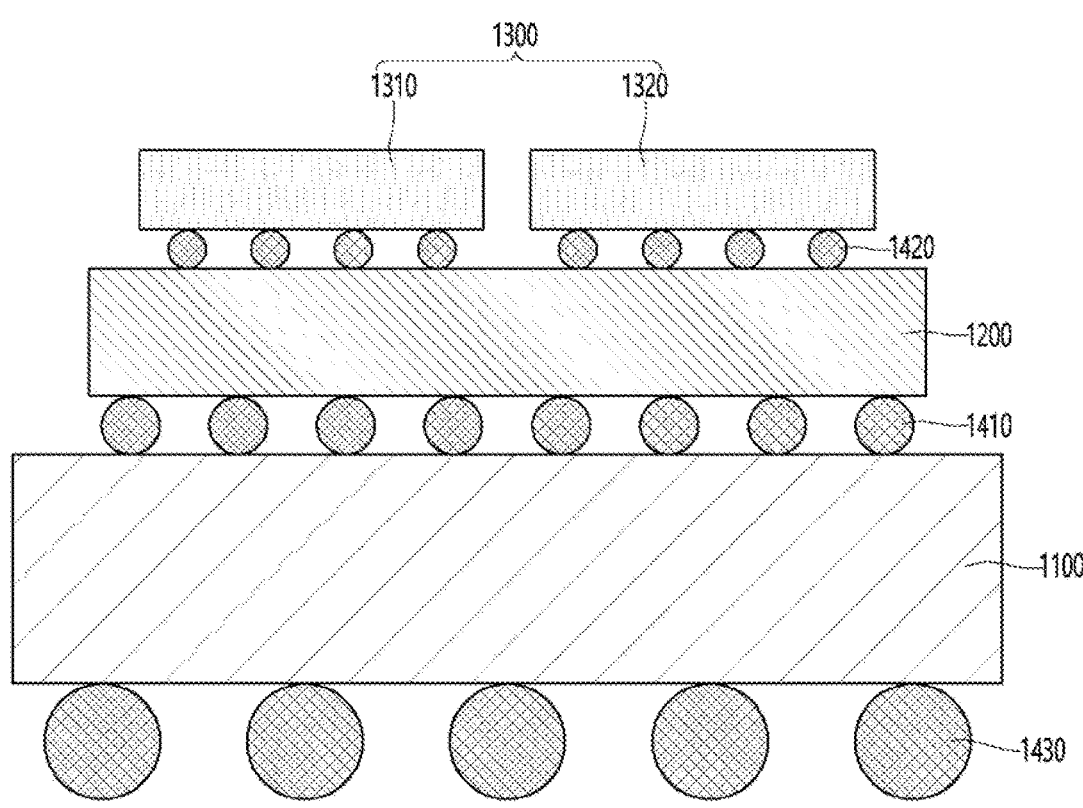

【FIG. 2B】
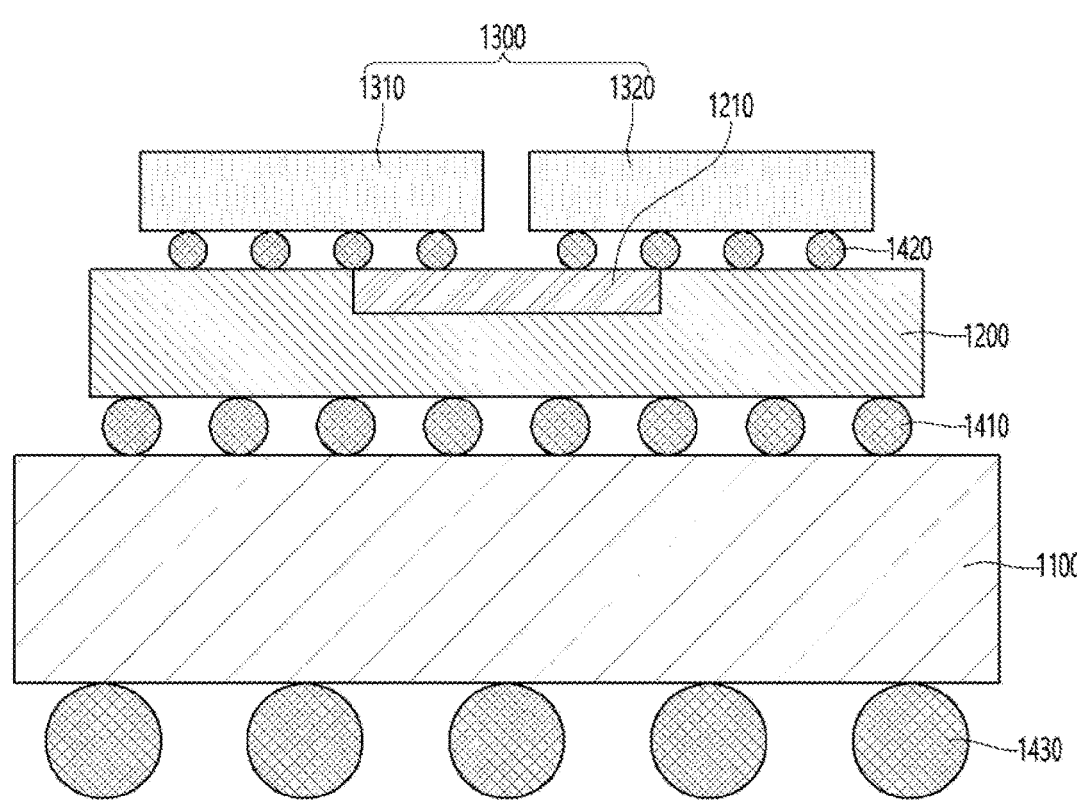

【FIG. 2C】
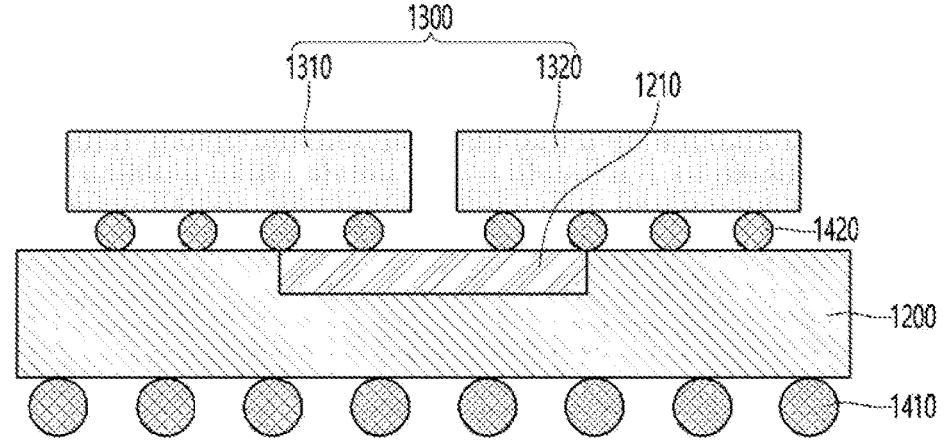
【FIG. 2D】
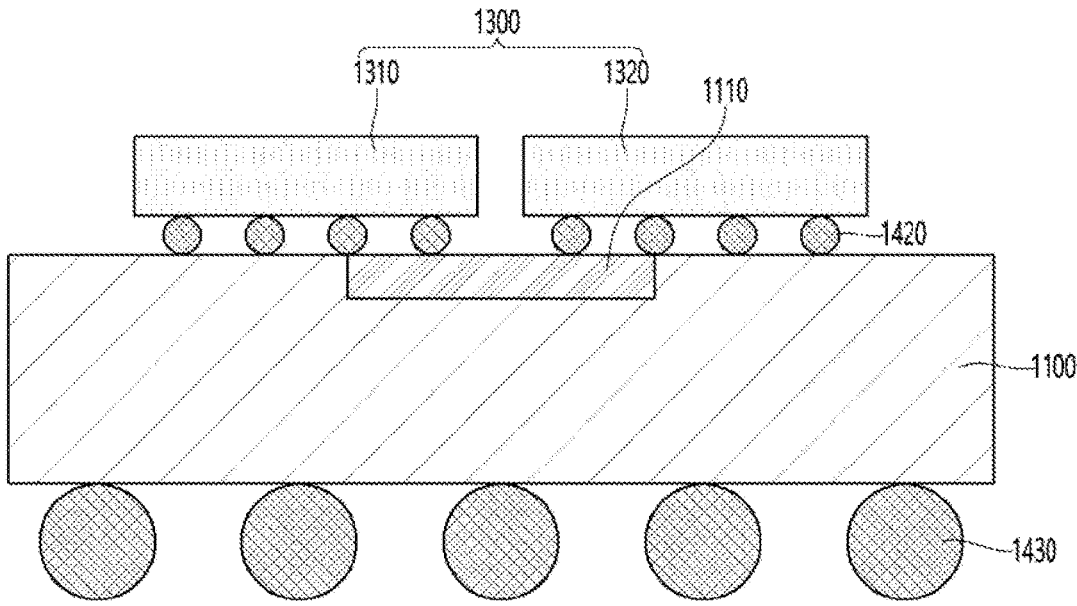

【FIG. 2E】
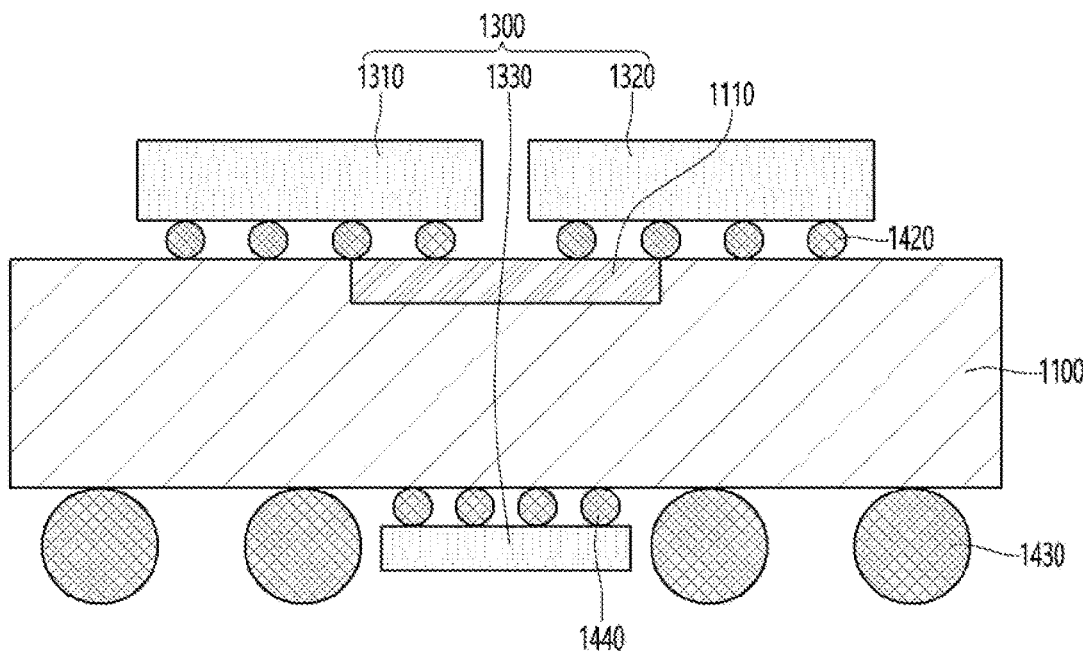

【FIG. 2F】
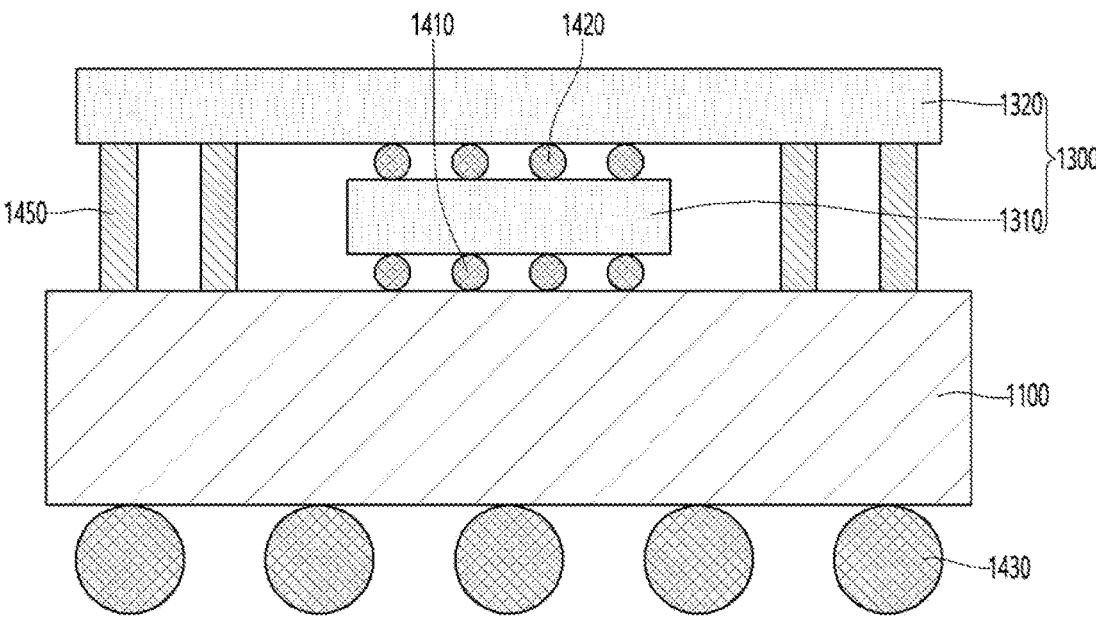
【FIG. 2G】
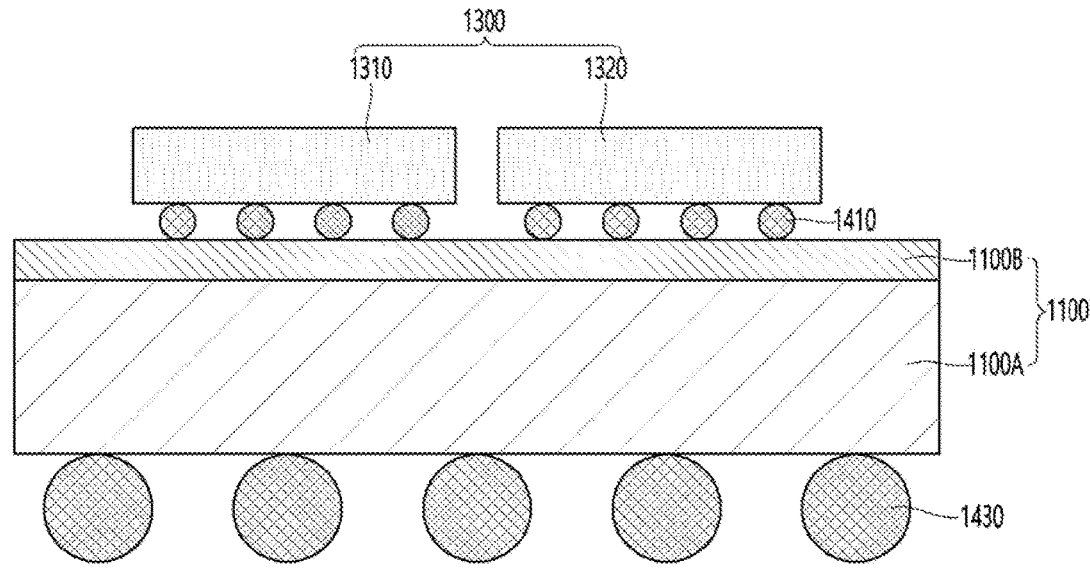

【FIG. 3A】
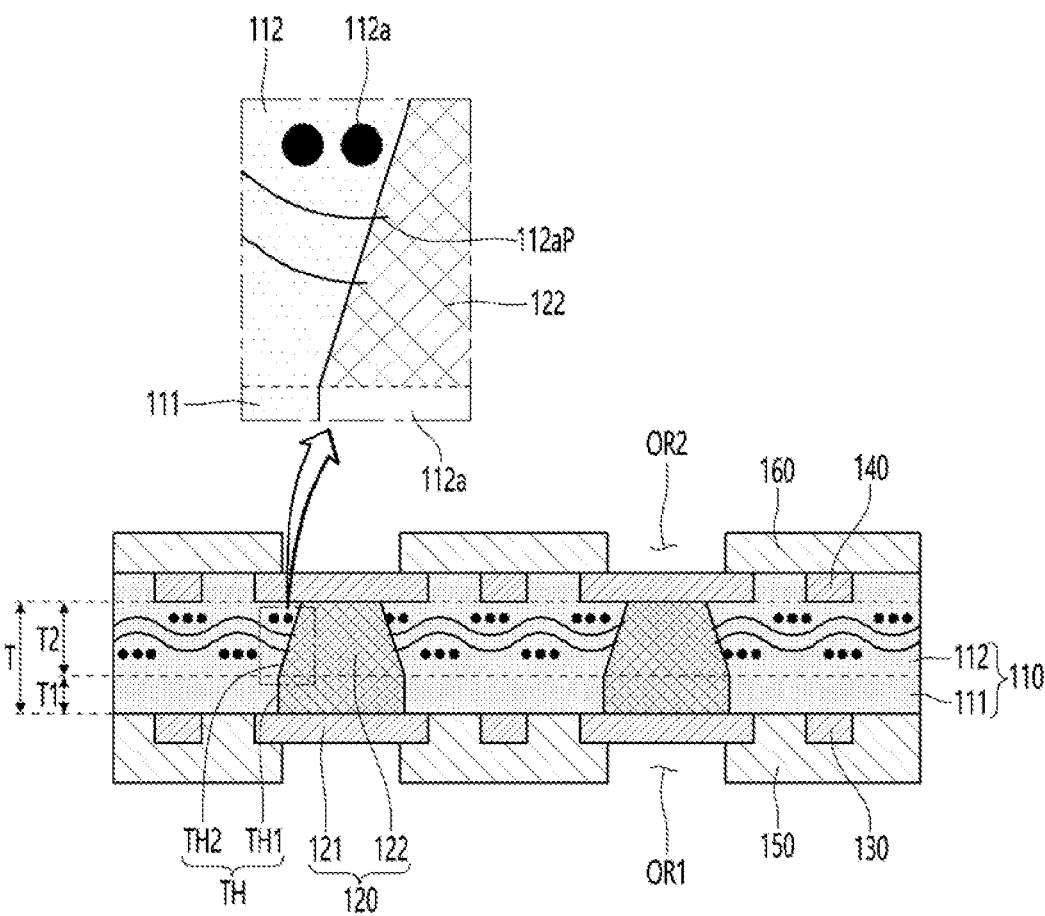

【FIG. 3B】
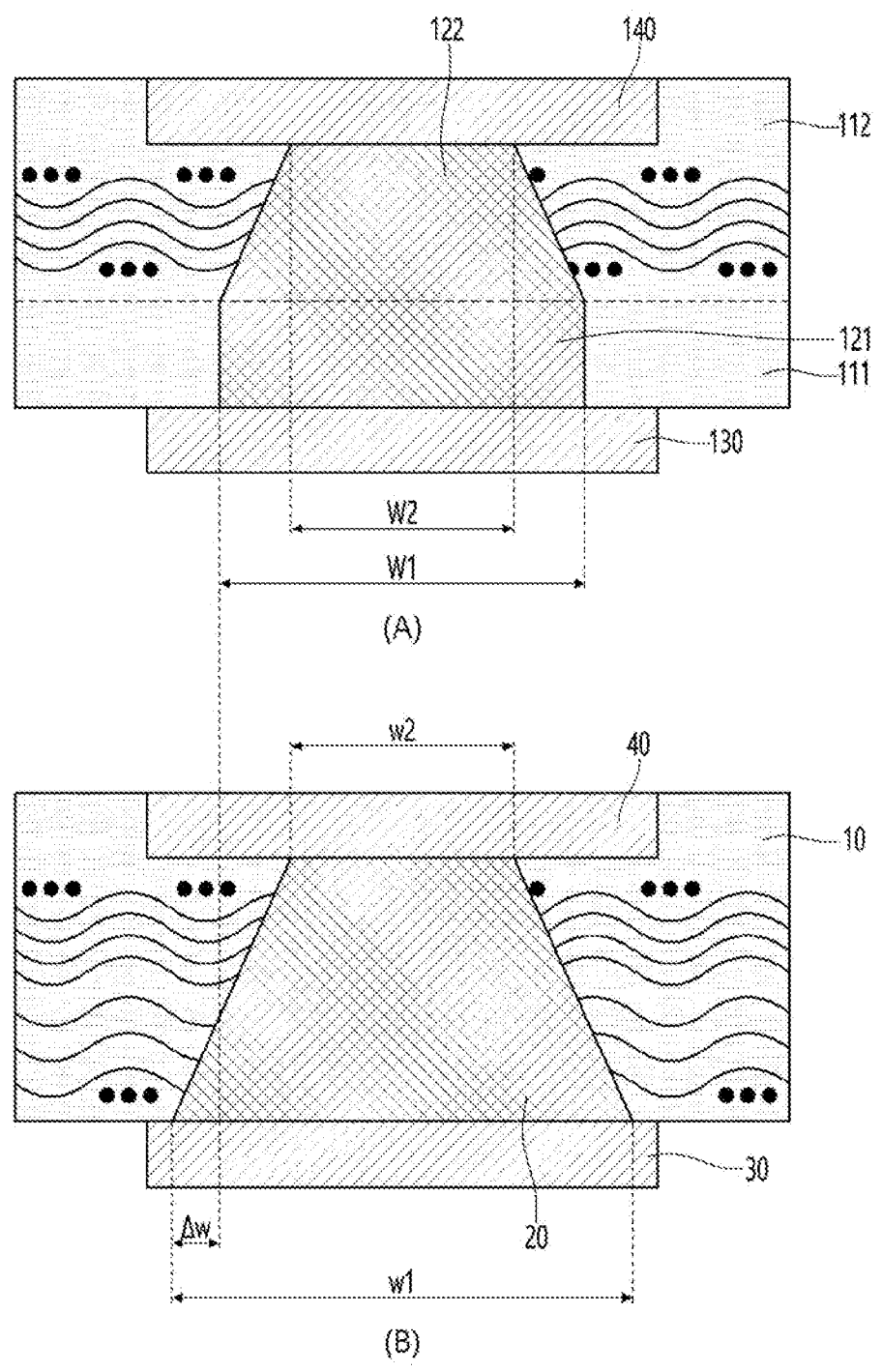
(A)
(B)

【FIG. 4】
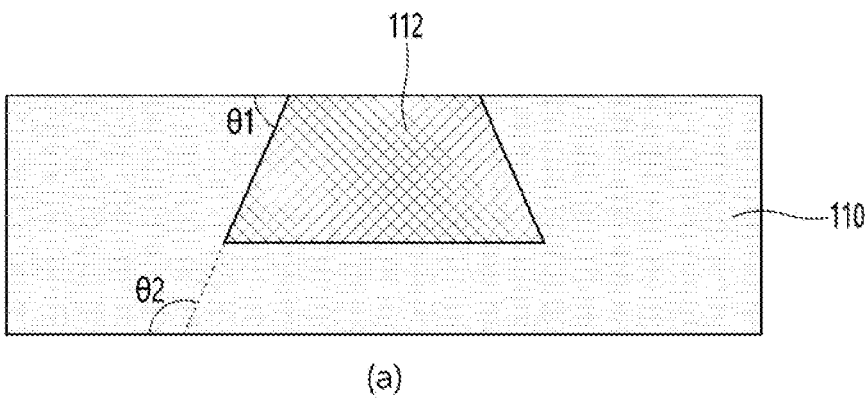
(a)
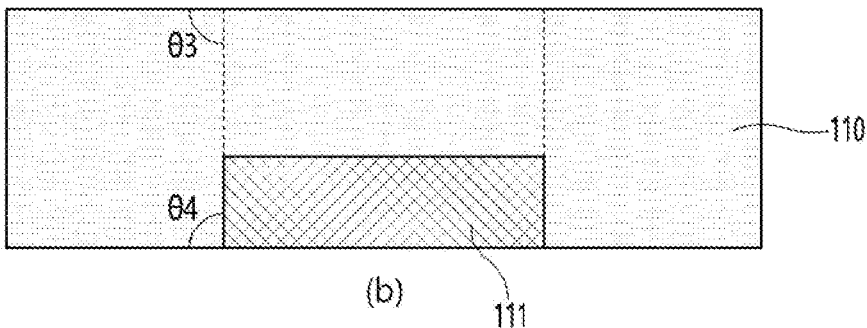
(b)

【FIG. 5】
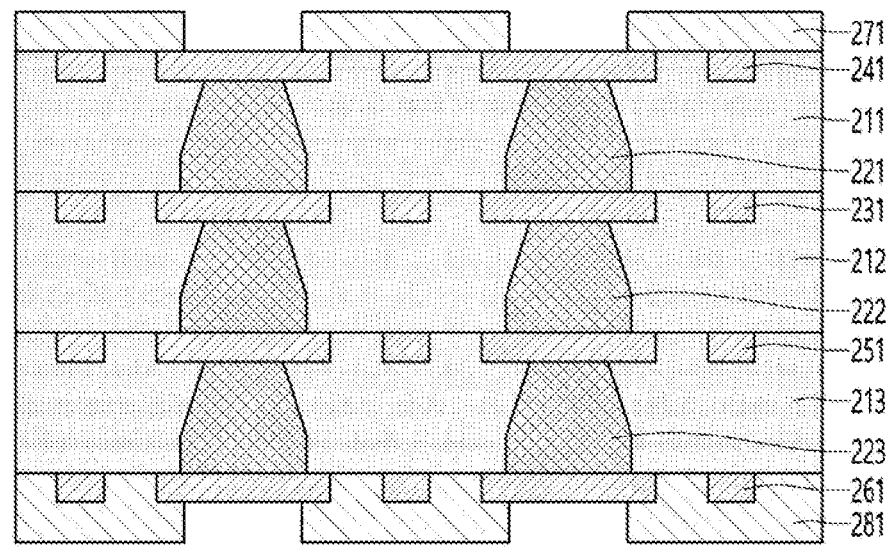
【FIG. 6】
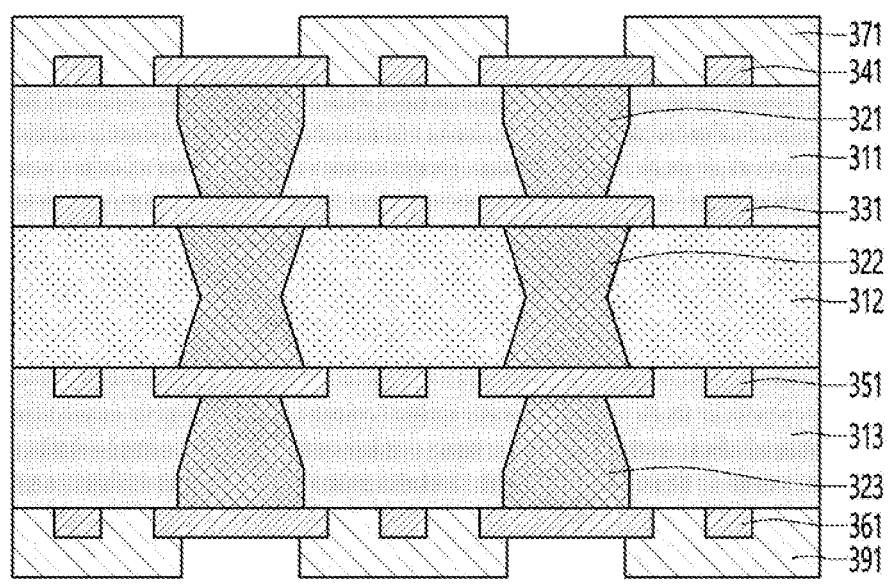

【FIG. 7】
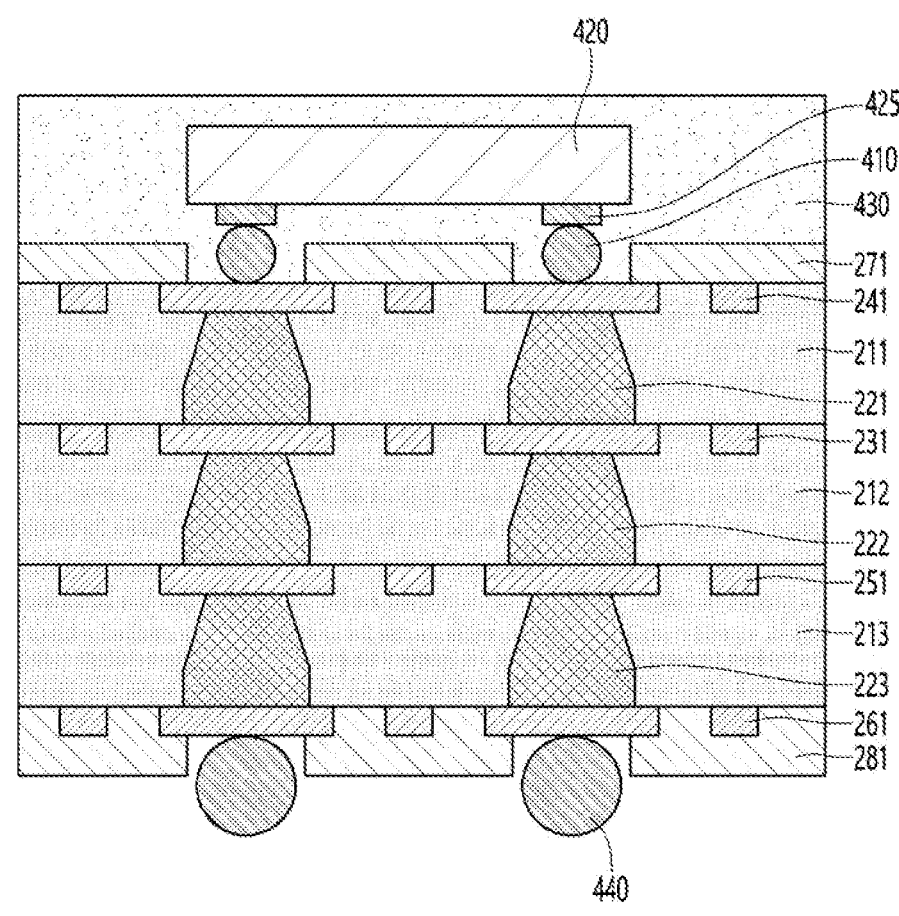
【FIG. 8A】
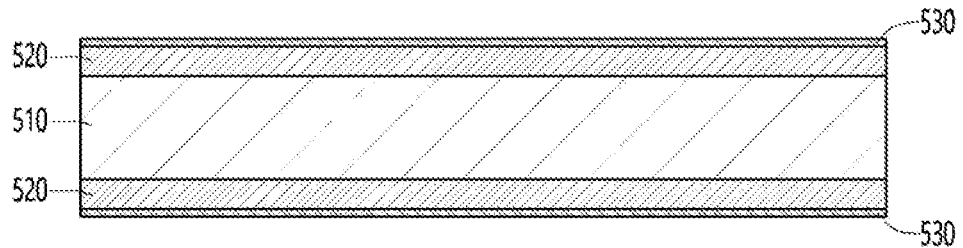

【FIG. 8B】
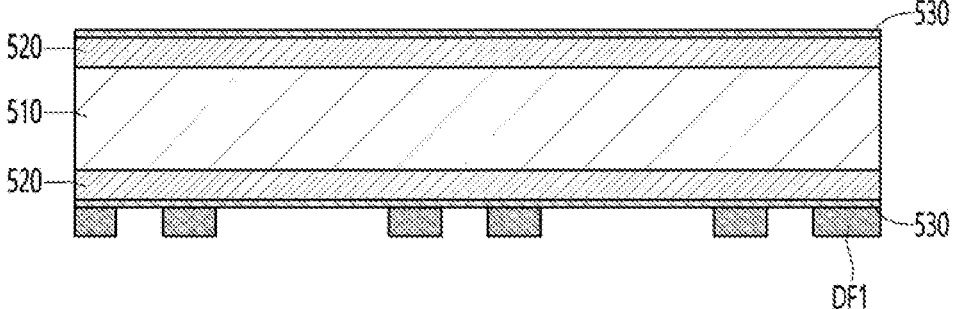
【FIG. 8C】
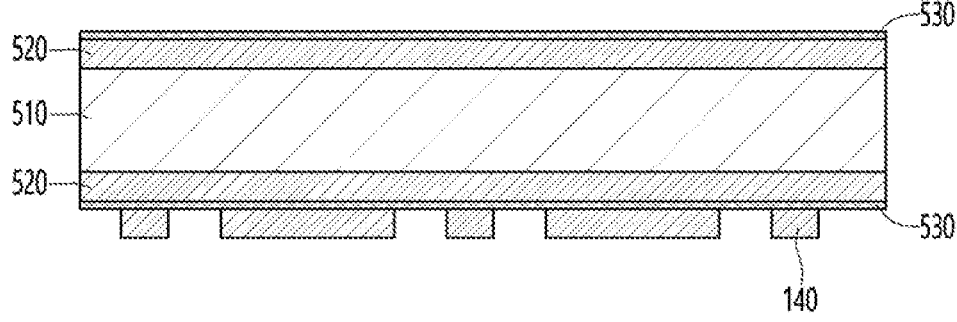

【FIG. 8D】
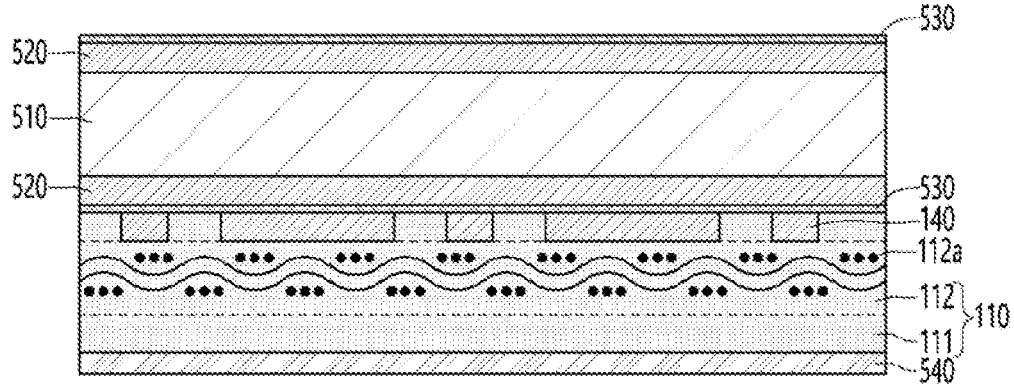
【FIG. 8E】
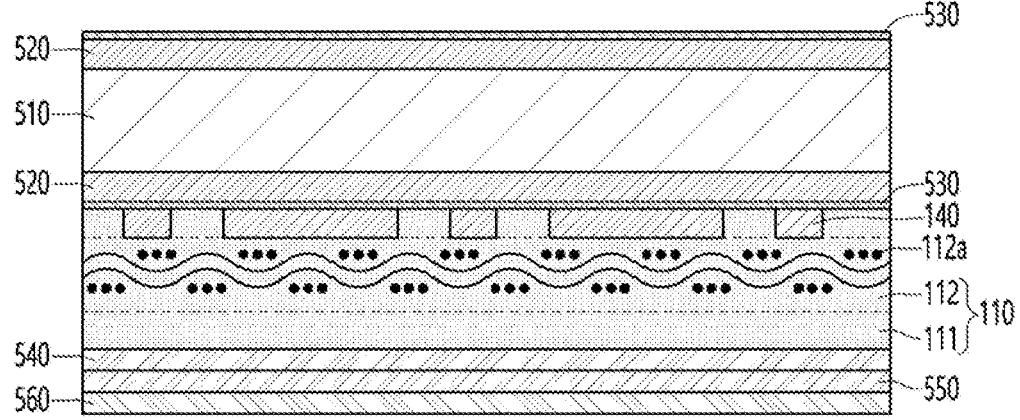

【FIG. 8F】
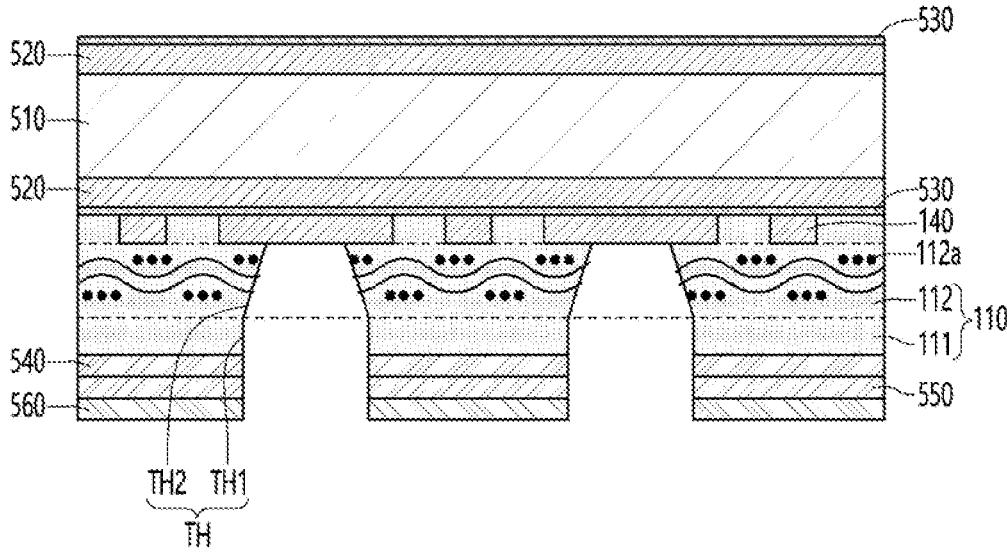
【FIG. 8G】
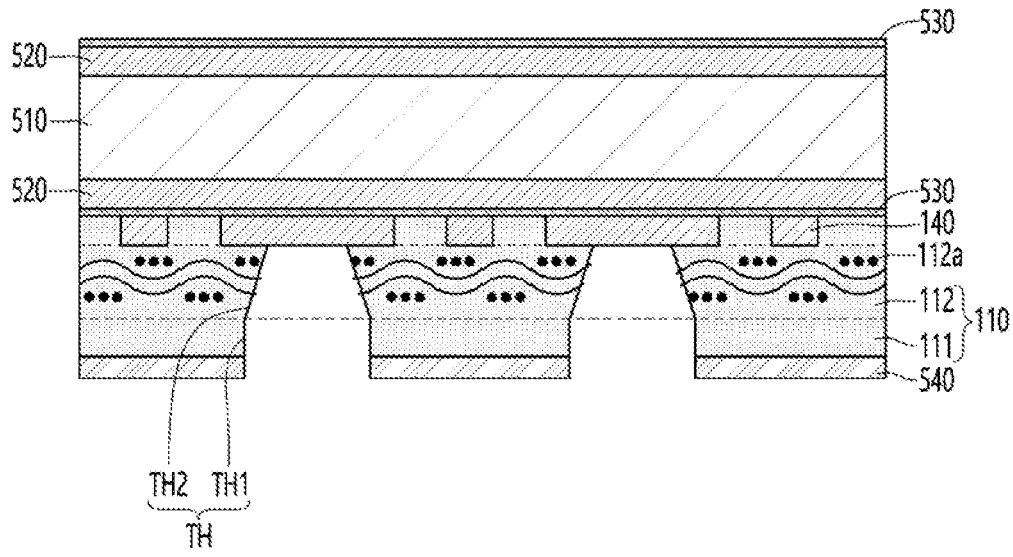

【FIG. 8H】
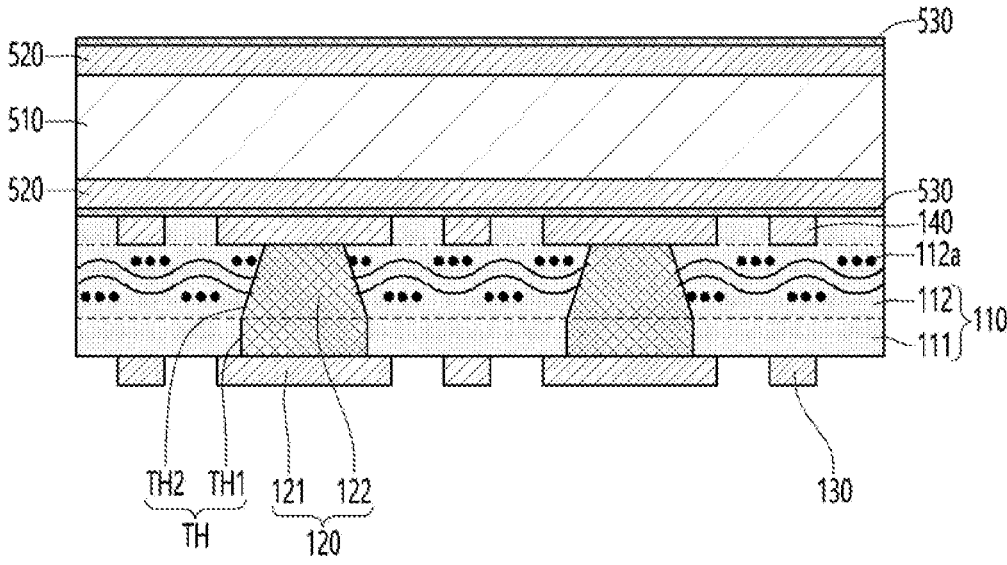
【FIG. 8I】
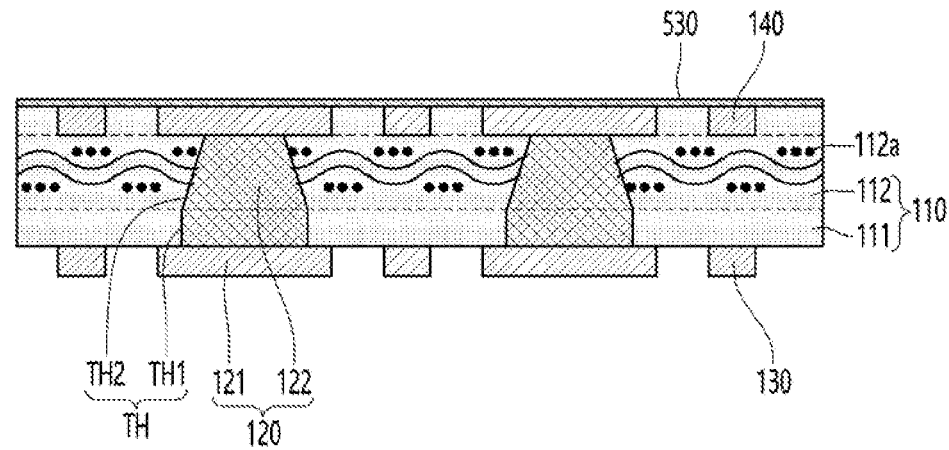

【FIG. 8J】
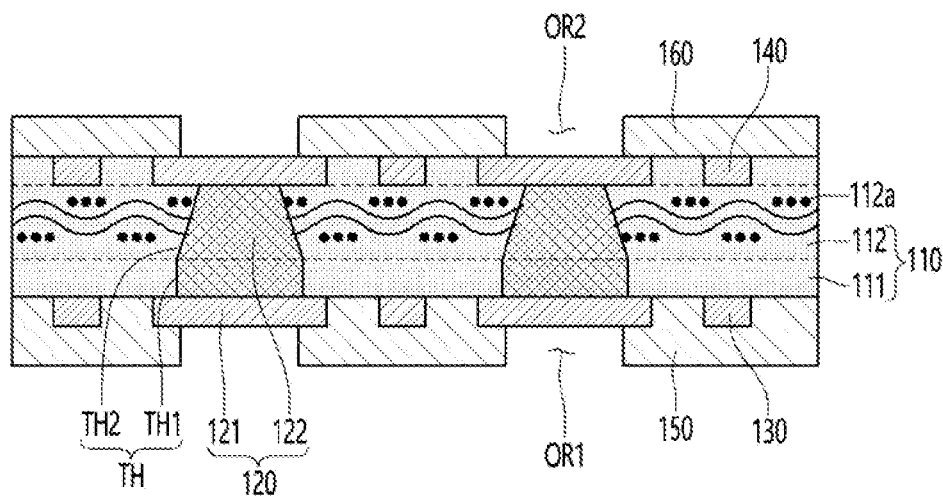

CIRCUIT BOARD AND SEMICONDUCTOR PACKAGE COMPRISING SAME

CROSS REFERENCE TO RELATED APPLICATIONS

This application is the National Phase of PCT International Application No. PCT/KR2022/011238, filed on Jul. 29, 2022, which claims priority under 35 U.S.C. 119 (a) to Patent Application No. 10-2021-0100186, filed in Republic of Korea on Jul. 29, 2021, all of which are hereby expressly incorporated by reference into the present application.

TECHNICAL FIELD

The embodiment relates to a circuit board and a semiconductor package including the same.

BACKGROUND

High performance of electric/electronic products is progressing, and accordingly, techniques for attaching a larger number of packages to a substrate having a limited size have been proposed and studied. However, a general package basically includes one semiconductor chip, and thus has limitations in having desired performance.

A general semiconductor package has a form in which a processor package in which a processor chip is disposed and a memory package to which a memory chip is attached are connected as one. The semiconductor package has advantages of reducing a chip mounting area and enabling high-speed signals through a short pass by manufacturing a processor chip and a memory chip into one integrated package. The package substrate can provide these advantages and is widely applied to mobile devices and the like.

On the other hand, a size of a package is increasing due to the high specification of electronic devices such as mobile devices and the adoption of High Bandwidth Memory (HBM). In addition, there is a demand for a circuit board that can configure each function into separate processor chips and mount these processor chips as the functions required for application processors increase. At this time, even when the application processor is divided into two processor chips for each function, a number of terminals (Input/Output) provided on each processor chip is increasing. At this time, unlike the case where all functions are processed by one application processor chip as in the comparative example, if the processor chip is divided into at least two, each processor chip must be electrically connected to each other to exchange signals.

At this time, if the spacing between each processor chip is great, a fine pattern as in the embodiment may not be required. However, if the spacing between each processor chip is great, a communication speed for mutual signal exchange may decrease. Additionally, power consumption required for communication increases as the spacing between each processor chip increases. In addition, when the spacing between each processor chip is great, a length of a trace connecting each processor chip also increases, which causes vulnerability to noise and increases signal transmission loss.

Accordingly, in order to connect all the wiring between a first processor chip and a second processor chip within the limited space as described above, a circuit pattern is required to be refined to a specific line width and a specific spacing or less.

On the other hand, the number of terminals in the first processor chip and the second processor chip is a trend that is gradually increasing due to the recent 5G, Internet of Things (IoT), increased image quality, and increased communication speed. Accordingly, recently, the number of connection wires between the first processor chip and the second processor chip may be more than twice that of the comparative example.

Accordingly, in order to mount the first processor chip and the second processor chip on one circuit board while minimizing the spacing between them, and connect the first processor chip and the second processor chip to each other within a limited space, there is a need for miniaturization of circuit patterns and through electrodes included in the circuit board.

However, in a prior art, there was a limit to reducing a width of a through hole due to process limitations in a laser process for forming the through hole, and further, there was a limit to reducing a width of a through electrode filling the through hole.

DISCLOSURE

Technical Problem

The embodiment provides a circuit board including a through hole or through electrode having a new shape, and a package substrate including the same.

In addition, the embodiment provides a circuit board including a through hole or a through electrode having an inflected portion according to at least two side inclinations, and a package substrate including the same.

In addition, the embodiment provides a circuit board capable of minimizing a width of a through electrode and a package substrate including the same.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

A circuit board according to an embodiment comprises a first insulating layer including an upper and lower surface; a first through electrode passing through the upper and lower surfaces of the first insulating layer; and a first circuit pattern layer disposed on a lower surface of the first insulating layer, wherein the first through electrode includes: a first electrode part disposed adjacent to the lower surface of the first insulating layer and having a first inclination; and a second electrode part disposed adjacent to the upper surface of the first insulating layer and having a second inclination that is different from the first inclination so that a width gradually decreases toward the first upper surface of the first insulating layer, and wherein the first electrode part non-overlaps in a horizontal direction with the first circuit pattern layer.

In addition, the circuit board further comprises a second insulating layer disposed on the first insulating layer; and a second through electrode passing through upper and lower surfaces of the second insulating layer, wherein the second through electrode includes: a third electrode part disposed adjacent to the lower surface of the second insulating layer and having a third inclination different from the first inclination and the second inclination so that a width gradually increases toward the upper surface of the second insulating layer; and a fourth electrode part disposed adjacent to the upper surface of the second insulating layer and includes having a fourth inclination corresponding to the first inclination.

In addition, the second electrode part has a symmetrical shape with the third electrode part based on the upper surface of the first insulating layer or the lower surface of the second insulating layer.

In addition, the circuit board further comprises a third insulating layer disposed between the first insulating layer and the second insulating layer; and a third through electrode passing through the third insulating layer, wherein the third through electrode includes: a fifth electrode part disposed adjacent to a lower surface of the third insulating layer and having a fifth inclination so that a width gradually decreases toward an upper surface of the third insulating layer; and a sixth electrode part disposed adjacent to the upper surface of the third insulating layer and having a sixth inclination so that a width gradually increases toward the upper surface of the third insulating layer.

In addition, the first insulating layer includes: a first region where the first electrode part is disposed, and a second region where the second electrode part is disposed, and wherein a content of a glass fiber in the second region is greater than a content of a glass fiber in the first region.

In addition, at least a portion of the glass fiber disposed in the second region protrude toward a through hole passing through the first insulating layer, and wherein at least a portion of the protruded glass fiber is disposed within the second electrode part.

In addition, a thickness of the first electrode part is different from a thickness of the second electrode part.

In addition, the thickness of the first region of the first insulating layer is smaller than the thickness of the second region of the first insulating layer, and wherein the thickness of the first electrode part is smaller than the thickness of the second electrode part.

In addition, an interior angle between the lower surface of the first insulating layer and the first inclination is smaller than an interior angle between the lower surface of the first insulating layer and the second inclination.

In addition, a width of an upper surface of the first electrode part satisfies a range between 95% and 105% of a width of a lower surface of the first electrode part.

In addition, a region with a smallest width among the second electrode parts is equal to a width of the upper surface of the first electrode part or the lower surface of the first electrode part.

In addition, the first inclination is perpendicular to the upper or lower surface of the insulating layer.

In addition, the insulating layer includes a prepreg.

In addition, a vertical cross section of the first electrode part has a rectangular shape with a width of an upper surface and a width of a lower surface being the same, and a vertical cross section of the second electrode part has a trapezoidal shape where a width of an upper surface is smaller than a width of a lower surface.

Meanwhile, the package substrate according to the embodiment comprises a circuit board; a connection part disposed on the circuit board; a chip disposed on the connection part; and a molding layer covering the chip, wherein the circuit board comprises an insulating layer including upper and lower surfaces; a through electrode passing through the upper and lower surfaces of the insulating layer; a first circuit pattern layer disposed on a lower surface of the insulating layer and connected to a lower surface of the through electrode; and a second circuit pattern layer disposed on the upper surface of the insulating layer and connected to the upper surface of the through electrode, and on which the connection part is disposed, wherein the through electrode includes a first electrode part disposed adjacent to the lower surface of the insulating layer and having a first inclination; and a second electrode part disposed adjacent to the upper surface of the insulating layer and having a second inclination that is different from the first inclination so that a width gradually decreases toward the upper surface of the insulating layer, wherein each of the first electrode part and the second electrode part does not overlap the first and second circuit pattern layers in a horizontal direction, and wherein the chip includes a first chip and a second chip arranged to be spaced apart from each other in a width direction, and wherein the first chip corresponds to a central processor (CPU), and the second chip corresponds to a graphics processor (GPU).

Meanwhile, a circuit board according to another embodiment comprises an insulating layer including an upper surface and a lower surface, and a through hole passing through the upper surface and the lower surface, wherein the insulating layer includes resin and glass fiber, wherein the through hole includes a first hole part disposed adjacent to the lower surface of the insulating layer and having a first inclination; and a second hole part disposed adjacent to the upper surface of the insulating layer, connected to the first hole part and having a second inclination so that the width gradually decreases toward the upper surface, and through which the glass fiber protrudes.

In addition, the circuit board further comprises a through electrode passing through the insulating layer and corresponding to the through hole, and wherein the through electrode includes a first electrode part corresponding to the first hole part and a second electrode part corresponding to the second hole part.

In addition, the circuit board further comprises a first circuit pattern layer disposed on the lower surface of the insulating layer, and wherein the first electrode part does not overlap the first circuit pattern layer in the horizontal direction.

Advantageous Effects

The embodiment includes an insulating layer. In addition, the insulating layer may be divided into a first region and a second region in a thickness direction. At this time, the embodiment includes a glass fiber-dense region in the second region of the insulating layer. In addition, the embodiment allows forming a through hole in the insulating layer including the dense region and filling the formed through hole with a conductive material to form a through electrode. Accordingly, the embodiment allows the through hole and the through electrode formed to fill the through hole to have different inclinations in the first region and the second region. For example, the embodiment allows a first hole part of a through hole or a first electrode part of a through electrode to be formed in the first region with little change in width, and allows the second hole part of a through hole or the second electrode part of a through electrode to have a second inclination whose width gradually decreases towards an upper portion in the second region. At this time, the embodiment may have a vertical cross-section having a square shape in a region adjacent to the lower surface with a relatively large width among the upper and lower surfaces of the through electrode. Accordingly, the embodiment can reduce the difference between the width of the upper and lower surfaces of the through electrode compared to the comparative example. Furthermore, the embodiment can reduce the difference between the width of the upper and lower surfaces of the through electrode, thereby reducing an overall size of the through electrode and further improving the circuit integration of the circuit board.

Furthermore, the embodiment allows the second region of the insulating layer to include a dense region of glass fibers, and thus the glass fibers may be partially exposed in the second hole part of the through hole. Additionally, the through electrode in the embodiment may be formed to cover the glass fiber exposed through the through hole. At this time, the exposed glass fibers function to increase a roughness of an inner wall of the through hole, and accordingly, when forming the through electrode, the adhesion between the insulating layer and the through electrode can be improved. Accordingly, the embodiment can solve the problem of the through electrode being separated from the insulating layer due to warpage that occurs in various usage environments of the circuit board. Accordingly, the physical and electrical reliability of the circuit board can be improved.

BRIEF DESCRIPTION OF THE DRAWINGS

FIG. 1A is a view for explaining problems with a circuit board according to a first comparative example.

FIG. 1B is a view for explaining problems with a circuit board according to a second comparative example.

FIG. 2A is a cross-sectional view illustrating a semiconductor package according to a first embodiment.

FIG. 2B is a cross-sectional view illustrating a semiconductor package according to a second embodiment.

FIG. 2C is a cross-sectional view illustrating a semiconductor package according to a third embodiment.

FIG. 2D is a cross-sectional view illustrating a semiconductor package according to a fourth embodiment.

FIG. 2E is a cross-sectional view illustrating a semiconductor package according to a fifth embodiment.

FIG. 2F is a cross-sectional view illustrating a semiconductor package according to a sixth embodiment.

FIG. 2G is a cross-sectional view illustrating a semiconductor package according to a seventh embodiment.

FIG. 3A is a view illustrating a circuit board according to a first embodiment.

FIG. 3B is a view for explaining a through electrode shown in FIG. 3A.

FIG. 4 is a view for explaining inclination of a through electrode according to an embodiment.

FIG. 5 is a view illustrating a circuit board according to a second embodiment.

FIG. 6 is a view illustrating a circuit board according to a third embodiment.

FIG. 7 is a view illustrating a package substrate according to an embodiment.

FIGS. 8A to 8J are views showing a method for manufacturing a circuit board shown in FIG. 3A in order of processes.

DETAILED DESCRIPTION OF THE EMBODIMENTS

Hereinafter, embodiments of the present disclosure will be described in detail with reference to the accompanying drawings.

However, the spirit and scope of the present disclosure is not limited to a part of the embodiments described, and may be implemented in various other forms, and within the spirit and scope of the present disclosure, one or more of the elements of the embodiments may be selectively combined and replaced.

In addition, unless expressly otherwise defined and described, the terms used in the embodiments of the present disclosure (including technical and scientific terms) may be construed the same meaning as commonly understood by one of ordinary skill in the art to which the present disclosure belongs, and the terms such as those defined in commonly used dictionaries may be interpreted as having a meaning that is consistent with their meaning in the context of the relevant art. In addition, the terms used in the embodiments of the present disclosure are for describing the embodiments and are not intended to limit the present disclosure.

In this specification, the singular forms may also include the plural forms unless specifically stated in the phrase, and may include at least one of all combinations that may be combined in A, B, and C when described in "at least one (or more) of A (and), B, and C". Further, in describing the elements of the embodiments of the present disclosure, the terms such as first, second, A, B, (a), and (b) may be used.

These terms are only used to distinguish the elements from other elements, and the terms are not limited to the essence, order, or order of the elements. In addition, when an element is described as being "connected", "coupled", or "contacted" to another element, it may include not only when the element is directly "connected" to, "coupled" to, or "contacted" to other elements, but also when the element is "connected", "coupled", or "contacted" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements. Further, when expressed as "on (over)" or "under (below)", it may include not only the upper direction but also the lower direction based on one element.

Comparative Example (Structure of Prior Art and its Problems)

FIG. 1A is a view for explaining problems with a circuit board according to a first comparative example, and FIG. 1B is a view for explaining problems with a circuit board according to a second comparative example.

Hereinafter, problems with the circuit board according to a comparative example will be described with reference to FIGS. 1A and 1B.

The circuit board of the comparative example includes an insulating layer 10, a through electrode 20, a first circuit pattern layer 30, and a second circuit pattern layer 40.

The insulating layer 10 may include glass fiber to ensure the rigidity of the circuit board. For example, the insulating layer 10 may include a prepreg containing resin and glass fibers dispersed within the resin.

The through electrode 20 may be formed to pass through the first surface of the insulating layer 10 and the second surface opposite to the first surface. For example, the through electrode 20 may be formed by filling through holes VH1 and VH2 passing through the insulating layer 10 with a metal material.

Additionally, a first circuit pattern layer 30 is connected to a first surface of the through electrode 20 and disposed on the first surface of the insulating layer 10.

In addition, a second circuit pattern layer 40 is connected to a second surface of the through electrode 20 and disposed on the second surface of the insulating layer 10.

Meanwhile, the comparative example processes the insulating layer 10 with a laser to form a through hole with a width corresponding to a target size that the through electrode 20 should have, and forms the through electrode 20 through a process of filling the formed through hole with a metal material.

At this time, the through electrode 20 in the comparative example has a first inclination whose width gradually decreases from a first surface to a second surface. That is, a first surface of the through electrode 20 may mean a surface with a greater width between the upper and lower surfaces of the through electrode 20, and the second surface of the through electrode 20 may mean a surface with a smaller width between the upper and lower surfaces of the through electrode 20.

Here, the through electrode 20 in the comparative example includes only one inclination whose width increases or decreases from the first surface to the second surface. Accordingly, the through electrode 20 in the comparative example has a difference in the width w1 of the first surface and the width w2 of the second surface corresponding to the inclination. For example, in the comparative example, the width w1 of the first surface of the through electrode 20 ranges from 1.5 to 3 times the width w2 of the second surface.

Accordingly, in the comparative example, there is a limit to reducing the size (for example, the width of the first surface and the width of the second surface) of the through electrode 20.

For example, as shown in (a) of FIG. 1B, in a comparative example, if laser processing is performed to form a through hole VH1 using the width w2 of the second surface of the through electrode 20 as the target width, the width w1 of the first surface of the through hole VH1 ranges from 1.5 to 3 times the width of the second surface, corresponding to the inclination of the through hole VH1. In this case, the comparative example has a problem in that the size of the through hole VH1 and the size of the through electrode 20 increase accordingly. Accordingly, the comparative example has a problem in that it is difficult to reduce the size (for example, the width of the first surface and the width of the second surface) of the through electrode 20. Furthermore, if the size of the through hole VH1 increases as described above, plating problems such as voids (a phenomenon in which part of the through hole is not filled) or dimples (a phenomenon in which the upper or lower surface of the electrode becomes dented) occur in the process of filling the metal material to form the through electrode 20. At this time, the void acts as a factor that reduces the rigidity of the through electrode 20, and there is a problem that cracks easily occur in the through electrode 20 due to the void. In addition, the dimple lowers the flatness of the through electrode 20 and further reduces the overall flatness of the circuit board.

In addition, as shown in (b) of FIG. 1B, in the comparative example, if the through hole VH2 is formed using the width w1 of the first surface of the through electrode 20 as the target width, there is a problem that the insulating layer 10 is not penetrated due to the inclination of the through hole VH2 (for example, the width of the second surface of the through hole has a value close to 0).

As described above, if a through hole is formed through a laser process and the formed through hole is filled with a metal material to form a through electrode, in the comparative example, there was a limitation in reducing the difference between the width w1 of the first surface and the width w2 of the second surface of the through electrode 20 due to the process limitations in the laser process, and accordingly, there was a limit to reducing the size of the through hole and through electrode. For example, in the comparative example, there was a limit to reducing the width w1 of the first surface of the through electrode to 40 μm or less.

Additionally, in the comparative example, a through hole is formed in the insulating layer 10 using a CNC (computer numerical control) drill, rather than laser processing, and then a through electrode is formed. At this time, if using the CNC drill, the width of the first surface and the second surface of the through hole may be substantially the same. However, when filling the inside of a through hole formed using a CNC drill with a metal material, it does not contain parts such as plated bridges, unlike through holes that have a trapezoidal shape, and accordingly, there is a problem in that it is difficult to uniformly fill the inside of the through hole with a metal material. For example, when filling a metal material, the filling speed decreases from the first surface to the second surface of the through hole. Accordingly, the filling is preferentially completed on the first surface of the through hole, and accordingly there is a problem in that the filling is not completely completed in the portion of the through hole close to the second surface.

In addition, in the comparative example, the through hole is filled using a hole plugging method to solve this problem. However, the hole plugging method includes multiple plating processes and hole plugging processes, and there is a problem that the plating process becomes longer due to this. Additionally, in the hole plugging process, the hole plugging is performed using plate making, and as a result, there is a problem in that a portion of the inside of the through hole is unfilled. At this time, the hole plugging process is a method of filling a portion of the through hole using copper and filling a remaining portion using a filling material. However, the filling material is made of a material different from the prepreg constituting the insulating layer 10 or the copper. Accordingly, a circuit board using the hole plugging method has a structure that is vulnerable to distortion due to a difference in thermal expansion coefficient between the prepreg, the copper, and the filling material, and thus has a problem of easily cracking.

Accordingly, the embodiment minimizes the difference between the width of the first surface and the second surface of the through hole and the through electrode and reduces the size (e.g. width of the first surface and width of second surface) of the through electrode.

Furthermore, the embodiment provides a circuit board with a new structure that implements a fine pitch according to the reduction in the size of the through electrode and achieves slimming, miniaturization, and high integration of the circuit board, and a package substrate including the same.

Electronic Device

Before describing the embodiment, an electronic device to which the semiconductor package of the embodiment is applied will be briefly described. The electronic device includes a main board (not shown). The main board may be physically and/or electrically connected to various components. For example, the main board may be connected to the semiconductor package of the embodiment. Various semiconductor devices may be mounted on the semiconductor package.

The semiconductor device may include an active device and/or a passive device. The active device may be a semiconductor chip in the form of an integrated circuit (IC) in which hundreds to millions of devices are integrated in one chip. The semiconductor device may be a logic chip, a memory chip, or the like. The logic chip may be a central processor (CPU), a graphics processor (GPU), or the like. For example, the logic chip may be an application processor (AP) chip including at least one of a central processor (CPU), a graphics processor (GPU), a digital signal processor, a cryptographic processor, a microprocessor and a microcontroller, or an analog-digital converter, an application-specific IC (ASIC), or the like, or a chip set comprising a specific combination of those listed so far.

The memory chip may be a stack memory such as HBM. The memory chip may also include a memory chip such as volatile memory (eg, DRAM), non-volatile memory (eg, ROM), flash memory, and the like.

On the other hand, a product group to which the semiconductor package of the embodiment is applied may be any one of CSP (Chip Scale Package), FC-CSP (Flip Chip-Chip Scale Package), FC-BGA (Flip Chip Ball Grid Array), POP (Package on Package) and SIP (System in Package), but is not limited thereto.

In addition, the electronic device may be a smart phone, a personal digital assistant, a digital video camera, a digital still camera, a vehicle, a high-performance server, a network system, computer, monitor, tablet, laptop, netbook, television, video game, smart watch, automotive, or the like. However, the embodiment is not limited thereto, and may be any other electronic device that processes data in addition to these.

Hereinafter, a semiconductor package including a circuit board according to an embodiment will be described. The semiconductor package of the embodiment may have various package structures including a circuit board to be described later. In addition, the circuit board in one embodiment may be a package substrate described below, and the circuit board in another embodiment may be an interposer described below.

FIG. 2A is a cross-sectional view illustrating a semiconductor package according to a first embodiment, FIG. 2B is a cross-sectional view illustrating a semiconductor package according to a second embodiment, FIG. 2C is a cross-sectional view illustrating a semiconductor package according to a third embodiment, FIG. 2D is a cross-sectional view illustrating a semiconductor package according to a fourth embodiment, FIG. 2E is a cross-sectional view illustrating a semiconductor package according to a fifth embodiment, FIG. 2F is a cross-sectional view illustrating a semiconductor package according to a sixth embodiment, and FIG. 2G is a cross-sectional view illustrating a semiconductor package according to a seventh embodiment.

Referring to FIG. 2A, the semiconductor package according to the first embodiment may include a first circuit board 1100, a second circuit board 1200, and a semiconductor device 1300.

The first circuit board 1100 means a package substrate.

For example, the first circuit board 1100 may provide a space to which at least one external substrate is coupled. The external substrate may refer to a second circuit board 1200 coupled to the first circuit board 1100. Also, the external substrate may refer to a main board included in an electronic device coupled to a lower portion of the first circuit board 1100.

Also, although not shown in the drawing, the first circuit board 1100 may provide a space in which at least one semiconductor device is mounted.

The first circuit board 1100 includes at least one insulating layer, an electrode disposed on the at least one insulating layer, and a through portion passing through the at least one insulating layer.

A second circuit board 1200 is disposed on the first circuit board 1100.

The second circuit board 1200 may be an interposer. For example, the second circuit board 1200 may provide a space in which at least one semiconductor device is mounted. The second circuit board 1200 may be connected to the at least one semiconductor device 1300. For example, the second circuit board 1200 may provide a space in which the first semiconductor device 1310 and the second semiconductor device 1320 are mounted. The second circuit board 1200 may electrically connect the first and second semiconductor devices 1310 and 1320 and the first circuit board 1100 while electrically connecting the first semiconductor device 1310 and the second semiconductor device 1320. That is, the second circuit board 1200 may perform a horizontal connection function between a plurality of semiconductor devices and a vertical connection function between the semiconductor devices and the package substrate.

FIG. 2 illustrates that the first and second semiconductor devices 1310 and 1320 are disposed on the second circuit board 1200, but is not limited thereto. For example, one semiconductor device may be disposed on the second circuit board 1200, or alternatively, three or more semiconductor devices may be disposed.

The second circuit board 1200 may be disposed between the semiconductor device 1300 and the first circuit board 1100.

In an embodiment, the second circuit board 1200 may be an active interposer that functions as a semiconductor device. When the second circuit board 1200 functions as a semiconductor device, the package of the embodiment may have a structure in which a plurality of logic chips are mounted on the first circuit board 1100 in a vertically stacked structure. In addition, a first logic chip corresponding to the active interposer among the logic chips may perform a signal transfer function between the second logic chip disposed thereon and the first circuit board 1100 while functioning as a corresponding logic chip.

According to another embodiment, the second circuit board 1200 may be a passive interposer. For example, the second circuit board 1200 may function as a signal relay between the semiconductor device 1300 and the first circuit board 1100. For example, a number of terminals of the semiconductor device 1300 is gradually increasing due to 5G, Internet of Things (IoT), increased image quality, and increased communication speed. That is, the number of terminals provided in the semiconductor device 1300 increases, thereby reducing the width of the terminals or an interval between the plurality of terminals. In this case, the first circuit board 1100 is connected to the main board of the electronic device. There is a problem in that the thickness of the first circuit board 1100 increases or the layer structure of the first circuit board 1100 becomes complicated in order for the electrodes provided on the first circuit board 1100 to have a width and an interval to be respectively connected to the semiconductor device 1300 and the main board. Accordingly, in the first embodiment, the second circuit board 1200 is disposed on the first circuit board 1100 and the semiconductor device 1300. In addition, the second circuit board 1200 may include electrodes having a fine width and an interval corresponding to the terminals of the semiconductor device 1300.

the semiconductor device 1300 may be an application processor (AP) chip including at least one of a central processor (CPU), a graphics processor (GPU), a digital signal processor, a cryptographic processor, a microprocessor and a microcontroller, or an analog-digital converter, an application-specific IC (ASIC), or the like, or a chip set comprising a specific combination of those listed so far. The memory chip may be a stack memory such as HBM. The memory chip may also include a memory chip such as volatile memory (e.g., DRAM), non-volatile memory (e.g., ROM), flash memory, and the like.

Meanwhile, the semiconductor package of the first embodiment may include a connection portion.

For example, the semiconductor package includes a first connection portion 1410 disposed between the first circuit board 1100 and the second circuit board 1200. The first connection portion 1410 electrically connects the second circuit board 1200 to the first circuit board 1100 while coupling them.

For example, the semiconductor package may include the second connection portion 1420 disposed between the second circuit board 1200 and the semiconductor device 1300. The second connection portion 1420 may electrically connect the semiconductor device 1300 to the second circuit board 1200 while coupling them.

The semiconductor package includes a third connection portion 1430 disposed on a lower surface of the first circuit board 1100. The third connection portion 1430 may electrically connect the first circuit board 1100 to the main board while coupling them.

At this time, the first connection portion 1410, the second connection portion 1420, and the third connection portion 1430 may electrically connect between the plurality of components by using at least one bonding method of wire bonding, solder bonding and metal-to-metal direct bonding.

That is, since the first connection portion 1410, the second connection portion 1420, and the third connection portion 1430 have a function of electrically connecting a plurality of components, when the metal-to-metal direct bonding is used, the connection portion of the semiconductor package may be understood as an electrically connected portion, not a solder or wire.

The wire bonding method may refer to electrically connecting a plurality of components using a conductive wire such as gold (Au). Also, the solder bonding method may electrically connect a plurality of components using a material containing at least one of Sn, Ag, and Cu. In addition, the metal-to-metal direct bonding method may refer to recrystallization by applying heat and pressure between a plurality of components without the presence of solder, wire, conductive adhesive, etc. and to directly bond between the plurality of components. In addition, the metal-to-metal direct bonding method may refer to a bonding method by the second connection portion 1420. In this case, the second connection portion 1420 may mean a metal layer formed between a plurality of components by the recrystallization.

Specifically, the first connection portion 1410, the second connection portion 1420, and the third connection portion 1430 may couple a plurality of components to each other by a thermal compression (TC) bonding method. The TC bonding may refer to a method of directly coupling a plurality of components by applying heat and pressure to the first connection portion 1410, the second connection portion 1420, and the third connection portion 1430.

In this case, at least one of the first circuit board 1100 and the second circuit board 1200 may include a protrusion provided in the electrode on the first connection portion

1410, the second connection portion 1420, and the third connection portion 1430 are disposed. The protrusion may protrude outward from the first circuit board 1100 or the second circuit board 1200.

The protrusion may be referred to as a bump. The protrusion may also be referred to as a post. The protrusion may also be referred to as a pillar. Preferably, the protrusion may refer to an electrode on which a second connection portion 1420 for coupling with the semiconductor device 1300 is disposed among the electrodes of the second circuit board 1200. That is, as a pitch of the terminals of the semiconductor device 1300 is reduced, a short circuit may occur in the second connection portions 1420 respectively connected to the terminals of the semiconductor device 1300. Accordingly, in the embodiment, the protrusion is included in the electrode of the second circuit board 1200 on which the second connection portion 1420 is disposed in order to reduce a volume of the second connection portion 1420. The protrusion may improve matching between the electrode of the second circuit board 1200 and the terminal of the semiconductor device 1300 and prevent diffusion of the second connection portion 1420.

Meanwhile, referring to FIG. 2B, the semiconductor package of the second embodiment is different from the semiconductor package of the first embodiment in that the connecting member 1210 is disposed on the second circuit board 1200. The connecting member 1210 may be referred to as a bridge substrate. For example, the connecting member 1210 may include a redistribution layer.

In an embodiment, the connecting member 1210 may be a silicon bridge. That is, the connecting member 1210 may include a silicon substrate and a redistribution layer disposed on the silicon substrate.

In another embodiment, the connecting member 1210 may be an organic bridge. For example, the connecting member 1210 may include an organic material. For example, the connecting member 1210 includes an organic substrate including an organic material instead of the silicon substrate.

The connecting member 1210 may be embedded in the second circuit board 1200, but is not limited thereto. For example, the connecting member 1210 may be disposed on the second circuit board 1200 to have a protruding structure.

Also, the second circuit board 1200 may include a cavity, and the connecting member 1210 may be disposed in the cavity of the second circuit board 1200.

The connecting member 1210 may horizontally connect a plurality of semiconductor devices disposed on the second circuit board 1200.

Referring to FIG. 2C, the semiconductor package according to the third embodiment includes a second circuit board 1200 and a semiconductor device 1300. In this case, the semiconductor package of the third embodiment has a structure in which the first circuit board 1100 is removed compared to the semiconductor package of the second embodiment.

That is, the second circuit board 1200 of the third embodiment may function as a package substrate while performing an interposer function.

The first connection portion 1410 disposed on the lower surface of the second circuit board 1200 may couple the second circuit board 1200 to the main board of the electronic device.

Referring to FIG. 2D, the semiconductor package according to the fourth embodiment includes a first circuit board 1100 and a semiconductor device 1300.

In this case, the semiconductor package of the fourth embodiment has a structure in which the second circuit board 1200 is removed compared to the semiconductor package of the second embodiment.

That is, the first circuit board 1100 of the fourth embodiment may function as an interposer connecting the semiconductor device 1300 and the main board while functioning as a package substrate. To this end, the first circuit board 1100 may include a connecting member 1110 for connecting the plurality of semiconductor devices. The connecting member 1110 may be a silicon bridge or an organic material bridge connecting a plurality of semiconductor devices.

Referring to FIG. 2E, the semiconductor package of the fifth embodiment further includes a third semiconductor device 1330 compared to the semiconductor package of the fourth embodiment.

To this end, a fourth connection portion 1440 is disposed on the lower surface of the first circuit board 1100.

In addition, a third semiconductor device 1330 may be disposed on the fourth connection portion 1400. That is, the semiconductor package of the fifth embodiment may have a structure in which semiconductor devices are mounted on upper and lower sides, respectively.

In this case, the third semiconductor device 1330 may have a structure disposed on the lower surface of the second circuit board 1200 in the semiconductor package of FIG. 2C.

Referring to FIG. 2F, the semiconductor package according to the sixth embodiment includes a first circuit board 1100.

A first semiconductor device 1310 may be disposed on the first circuit board 1100. To this end, a first connection portion 1410 is disposed between the first circuit board 1100 and the first semiconductor device 1310.

In addition, the first circuit board 1100 includes a conductive coupling portion 1450. The conductive coupling portion 1450 may further protrude from the first circuit board 1100 toward the second semiconductor device 1320. The conductive coupling portion 1450 may be referred to as a bump or, alternatively, may also be referred to as a post. The conductive coupling portion 1450 may be disposed to have a protruding structure on an electrode disposed on an uppermost side of the first circuit board 1100.

A second semiconductor device 1320 is disposed on the conductive coupling portion 1450 of the first circuit board 1100. In this case, the second semiconductor device 1320 may be connected to the first circuit board 1100 through the conductive coupling portion 1450. In addition, a second connection portion 1420 may be disposed on the first semiconductor device 1310 and the second semiconductor device 1320.

Accordingly, the second semiconductor device 1320 may be electrically connected to the first semiconductor device 1310 through the second connection portion 1420.

That is, the second semiconductor device 1320 is connected to the first circuit board 1100 through the conductive coupling portion 1450, and is also connected to the first semiconductor device 1310 through the second connection portion 1420.

In this case, the second semiconductor device 1320 may receive a power signal through the conductive coupling portion 1450. Also, the second semiconductor device 1320 may transmit and receive a communication signal to and from the first semiconductor device 1310 through the second connection portion 1420.

The semiconductor package according to the sixth embodiment provides a power signal to the second semiconductor device 1320 through the conductive coupling portion 1450, thereby providing sufficient power for driving the second semiconductor device 1320. Accordingly, the embodiment may improve the driving characteristics of the second semiconductor device 1320. That is, the embodiment may solve the problem of insufficient power provided to the second semiconductor device 1320. Furthermore, in the embodiment, the power signal and the communication signal of the second semiconductor device 1320 are provided through different paths through the conductive coupling portion 1450 and the second connection portion 1420. Through this, the embodiment can solve the problem that the communication signal is lost due to the power signal. For example, the embodiment may minimize mutual interference between communication signals of power signals. Meanwhile, the second semiconductor device 1320 according to the sixth embodiment may have a POP structure and be disposed on the first circuit board 1100. For example, the second semiconductor device 1320 may be a memory package including a memory chip. In addition, the memory package may be coupled on the conductive coupling portion 1450. In this case, the memory package may not be connected to the first semiconductor device 1310.

Referring to FIG. 2G, the semiconductor package according to the seventh embodiment includes a first circuit board 1100, a first connection portion 1410, a first connection portion 1410, a semiconductor device 1300, and a third connection portion 1430.

In this case, the semiconductor package of the seventh embodiment is different from the semiconductor package of the fourth embodiment in that the first circuit board 1100 includes a plurality of substrate layers while the connecting member 1110 is removed.

The first circuit board 1100 includes a plurality of substrate layers. For example, the first circuit board 1100 may include a first substrate layer 1100A corresponding to a package substrate and a second substrate layer 1100B corresponding to a redistribution layer of the connecting member.

That is, in the first circuit board 1100, a second substrate layer 1100B corresponding to a redistribution layer is disposed on the first substrate layer 1100A.

In other words, the semiconductor package of the seventh embodiment includes the first substrate layer 1100A and the second substrate layer 1100B integrally formed. The material of the insulating layer of the second substrate layer 1100B may be different from the material of the insulating layer of the first substrate layer 1100A. For example, the material of the insulating layer of the second substrate layer 1100B may include a photocurable material. For example, the second substrate layer 1100B may be a photo imageable dielectric (PID). In addition, since the second substrate layer 1100B includes a photocurable material, it is possible to miniaturize the electrode. Accordingly, in the seventh embodiment, the second substrate layer 1100B may be formed by sequentially stacking an insulating layer of a photo-curable material on the first substrate layer 1100A and forming a miniaturized electrode on the insulating layer of the photo-curable material. Through this, the second substrate 1100B may be a redistribution layer including a miniaturized electrode.

Hereinafter, the circuit board of the embodiment will be described.

Before describing the circuit board of the embodiment, the circuit board described below may mean any one of a plurality of circuit boards included in the previous semiconductor package.

For example, in one embodiment, the circuit board described below may refer to the first circuit board 1100 shown in any one of FIGS. 2A to 2G. Additionally, the circuit board described below in another embodiment may refer to the second circuit board 1200 shown in any one of FIGS. 2A to 2G.

Embodiment

FIG. 3A is a view illustrating a circuit board according to a first embodiment, and FIG. 3B is a view for explaining a through electrode shown in FIG. 3A.

Hereinafter, a circuit board according to an embodiment will be described in detail with reference to FIGS. 3A and 3B.

Referring to FIGS. 3A and 3B, the circuit board may include an insulating layer 110, a through electrode 120, a first circuit pattern layer 130, and a second circuit pattern layer 140.

The circuit board of the embodiment may be formed as a single layer based on the number of insulating layers. For example, a circuit board may contain only one insulating layer. In this case, the first circuit pattern layer 130 may refer to a circuit pattern layer disposed at a lowest side of the circuit board, and the second circuit pattern layer 140 may refer to a circuit pattern layer disposed at an uppermost side of the circuit board.

However, the embodiment is not limited to this. For example, the circuit board may have a multilayer structure. Also, if the circuit board has a multilayer structure, the insulating layer 110 shown in FIG. 2 may represent one insulating layer among the multilayer insulating layers. For example, if the circuit board has a multilayer structure, the insulating layer 110 shown in FIG. 2 may represent an uppermost insulating layer on which a second circuit pattern layer 140 having an ETS (Embedded Trace Substrate) structure is disposed. And, if the circuit board has a multilayer structure, the lower protective layer 150 may be removed in the circuit board shown in FIG. 3A or FIG. 3B.

The insulating layer 110 may include a prepreg (PPG). For example, the insulating layer 110 increases the physical rigidity of the circuit board, thereby improving the warpage of the circuit board.

The prepreg constituting the insulating layer 110 of the embodiment may have a structure in which a fiber layer in the form of a fabric sheet, such as a glass fabric woven with glass fiber yarn, is impregnated with an epoxy resin or the like. However, the prepreg constituting the insulating layer 110 of the embodiment may include a fiber layer in the form of a fabric sheet woven with carbon fiber yarn.

Specifically, the insulating layer 110 may include a resin and a reinforcing fiber disposed in the resin. The resin may be an epoxy resin, but is not limited thereto. The resin is not particularly limited to the epoxy resin, and for example, one or more epoxy groups may be included in the molecule, or alternatively, two or more epoxy groups may be included, or alternatively, four or more epoxy groups may be included. In addition, the resin of the insulating layer 110 may include a naphthalene group, for example, may be an aromatic amine type, but is not limited thereto. For example, the resin may be include a bisphenol A type epoxy resin, a bisphenol F type epoxy resin, a bisphenol S type epoxy resin, a phenol novolac type epoxy resin, an alkylphenol novolac type epoxy resin, a biphenyl type epoxy resin, an aralkyl type epoxy resin, dicyclopentadiene type epoxy resin, naphthalene type epoxy resin, naphthol type epoxy resin, epoxy resin of condensate of phenol and aromatic aldehyde having phenolic hydroxyl group, biphenyl aralkyl type epoxy resin, fluorene type epoxy resin resins, xanthene-type epoxy resins, triglycidyl isocyanurate, rubber-modified epoxy resins, phosphorous-based epoxy resins, and the like, and naphthalene-based epoxy resins, bisphenol A-type epoxy resins, and phenol novolac epoxy resins, cresol novolak epoxy resins, rubber-modified epoxy resins, and phosphorous-based epoxy resins. In addition, the reinforcing fiber may include glass fiber, carbon fiber, aramid fiber (e.g., aramid-based organic material), nylon, silica-based inorganic material or titania-based inorganic material. The reinforcing fibers may be arranged in the resin to cross each other in a planar direction.

Meanwhile, it may be glass fiber, carbon fiber, aramid fiber (e.g., aramid-based organic material), nylon, silica-based inorganic material, or titania-based inorganic material.

The insulating layer 110 of the embodiment may be divided into a plurality of regions. For example, the insulating layer 110 may be divided into a first region 111 and a second region 112 in a thickness direction. The first region 111 and the second region 112 may be divided by a density of glass fibers disposed therein.

At this time, the first region 111 and the second region 112 are simply for dividing one single insulating layer 110 in a thickness direction, and the single insulating layer 110 may not mean that it has a multiple layer structure.

For example, the insulating layer 110 may be divided into two regions in the thickness direction. Additionally, the density of glass fibers included in the two regions of the insulating layer 110 may be different.

For example, the insulating layer 110 includes an upper surface (or first surface) and a lower surface (or second surface).

Additionally, a first circuit pattern layer 130 and a second circuit pattern layer 140 may be disposed on lower and upper surfaces of the insulating layer 110, respectively.

Additionally, the insulating layer 110 may be divided into a first region 111 adjacent to the lower surface of the insulating layer 110 and a second region 112 adjacent to the upper surface of the insulating layer 110.

Here, a density of glass fibers in the first region 111 may be different from a density of glass fibers in the second region 112.

For example, the density of glass fibers in the second region 112 may be greater than the density of glass fibers in the first region 111. For example, the first region 111 may not contain glass fibers, and the second region 112 may contain glass fibers 112a. As another example, glass fibers 112a may be concentrated in the second region 112 of the insulating layer 110, and the first region 111 may include a portion of a total content of glass fibers within the insulating layer 110.

At this time, the first region 111 and the second region 112 may be divided by a irradiation direction of a laser beam for forming a through hole in the insulating layer 110 during a process of manufacturing the circuit board. For example, in a structure of the circuit board of FIG. 3A, a laser beam may be radiated from an upper side of the insulating layer 110 to the lower surface of the insulating layer 110, in order to form a through hole VH in the insulating layer 110. For example, in the process of forming a through hole VH, the first region 111 may refer to the region located closest to the laser beam, and the second region 112 may refer to a region located further away from the laser beam compared to the first region 111.

For example, in the embodiment, the first region 111 may contain 0 wt % to 10 wt % of a total content of glass fibers in the insulating layer 110. And the second region 112 may contain 90 wt % to 100 wt % of glass fiber, which is more than the content of glass fiber in the first region 111.

At this time, if the content of glass fiber in the first region 111 is greater than 10 wt % or the content of glass fiber in the second region 112 is less than 90 wt %, the through hole formed in the first region 111 has an inclination whose width decreases toward the second region 112, and accordingly, it will have a shape substantially corresponding to the through hole as in the comparative example of FIG. 1A. And, in this case, there may be problems similar to those in the comparative example above.

That is, in the embodiment, glass fibers are substantially not included in the first region 111 of the insulating layer 110 located adjacent to the position where the laser beam is irradiated. Through this, in the embodiment, the inclination of the through hole formed in the first region 111 is substantially perpendicular to the upper or lower surface of the insulating layer 110. For example, if the first region 111 does not contain glass fibers, the problem of the intensity of the laser beam decreasing in the direction of the thickness of the insulating layer 110 can be minimized. Based on this, the embodiment allows a uniform laser beam to be irradiated to the first region 111, and Accordingly, a first through-hole part VH1 whose upper and lower surfaces have substantially the same width can be formed in the first region 111.

Furthermore, in order to increase the rigidity of the insulating layer 110 and thereby improve the warpage characteristics of the circuit board, the embodiment allows the glass fibers 112a to be included in the insulating layer 110 and allows the glass fibers 112a to be concentrated in the second region 112.

Meanwhile, in the above, the density or content of the glass fibers of the insulating layer 110 is adjusted as the distance from the laser beam increases, based on the position where the laser beam is irradiated, so that the inclination of the through hole part in a region adjacent to the laser beam irradiation position is substantially vertical. But, the embodiment is not limited to this. For example, the embodiment may allow the inclination of the through hole formed in the first region 111 of the insulating layer 110 to be vertical through methods other than controlling the density or content of the glass fibers and allow the vertical cross-section of the through hole formed in the first region 111 to have a square shape.

Meanwhile, when a through hole VH is formed in the insulating layer 110, the through electrode 120 can be formed by filling the inside of the formed through hole with a conductive material.

The through hole may be formed by any one of mechanical, laser, and chemical processing. When the via through is formed by machining, methods such as milling, drilling, and routing may be used, when formed by laser processing, a UV or CO2 laser method may be used, when formed by chemical, a chemical containing amino silane, ketones, or the like. Accordingly, at least one of plurality of insulating layers may be opened.

Meanwhile, in the embodiment, processing using a laser is performed to form the through hole VH. The laser processing is a cutting method that concentrates optical energy on a surface to melt and evaporate a part of the material to take a desired shape, accordingly, complex formations by computer programs can be easily processed, and even composite materials that are difficult to cut by other methods can be processed.

In addition, the laser processing has a cutting diameter of at least 0.005 mm, and has a wide range of possible thicknesses.

As the laser processing drill, it is preferable to use a YAG (Yttrium Aluminum Garnet) laser, a CO2 laser, or an ultraviolet (UV) laser. YAG laser is a laser that can process both copper foil layers and insulating layers, and CO2 laser is a laser that can process only insulating layers.

When the through hole is formed, the through electrode 120 may be formed by filling the inside of the through hole with a conductive material. The metal material forming the through part may be any one material selected from copper (Cu), silver (Ag), tin (Sn), gold (Au), nickel (Ni), and palladium (Pd). In addition, the conductive material filling may use any one or a combination of electroless plating, electrolytic plating, screen printing, sputtering, evaporation, ink-jetting and dispensing.

Meanwhile, a thickness T1 of the first region 111 and a thickness T2 of the second region 112 of the insulating layer 110 may be different from each other. For example, if the thickness T1 in the first region 111 of the insulating layer (110) is greater than the thickness T2 in the second region 112, the content of glass fibers included in the second region 112 may decrease, resulting in a decrease in the rigidity of the circuit board or a decrease in warpage characteristics. Accordingly, in the embodiment, the thickness T1 of the first region 111 is smaller than the thickness T2 of the second region 112.

Furthermore, a ratio of the thickness T1 of the first region 111 to the total thickness T of the insulating layer 110 may be 20% to 40%. Additionally, the thickness T2 of the second region 112 is set to be 60% to 80% of the total thickness T. If the thickness T1 of the first region 111 is less than 20% of the total thickness T or the thickness T2 of the second region 112 is greater than 80% of the total thickness T, a thickness of a first hole part of the through hole formed in the first region or the first electrode part of the through electrode is reduced, and accordingly, a difference between the width of the upper surface and the lower surface of the through electrode 120 may not be significantly different from the comparative example. In addition, if the thickness T1 of the first region 111 is less than 40% of the total thickness T or the thickness T2 of the second region 112 is greater than 60% of the total thickness T, the content of glass fiber in the insulating layer 110 decreases, and thus the rigidity of the insulating layer 110 or the rigidity of the circuit board decreases, and accordingly, the warpage characteristics of the circuit board may deteriorate.

In the circuit board of the embodiment, a through electrode 120 may be formed by filling the through hole VH passing through the insulating layer 110.

The through electrode 120 includes a first electrode part 121 passing through the first region 111 of the insulating layer 110 and a second electrode part 122 passing through the second region 112 of the insulating layer 110.

Specifically, the first electrode part 121 is disposed adjacent to the lower surface of the insulating layer 110 and may have a first inclination whose width does not change toward the upper surface of the insulating layer 110. The first inclination may mean an inclination of a side surface of the first electrode part 121 with respect to a lower surface of the insulating layer 110. Differently, the first inclination may mean an inclination of a side surface of the first electrode part 121 with respect to an upper surface of the insulating layer 110.

Additionally, the second electrode part 122 may be disposed on the first electrode part 121. For example, the second electrode part 122 may be disposed adjacent to the upper surface of the insulating layer 110. The second electrode part 122 may have a second inclination so that the width gradually decreases toward the upper surface of the insulating layer 110. That is, the second electrode part 122 may have a second inclination that is different from the first inclination of the first electrode part 121. The second inclination may mean an inclination of a side surface of the second electrode part 122 with respect to the lower surface of the insulating layer 110. Alternatively, the second inclination may mean an inclination of the side surface of the second electrode part 122 with respect to the upper surface of the insulating layer 110.

In other words, the first inclination of the side surface of the first electrode part 121 with respect to the lower surface of the insulating layer 110 may be different from the second inclination of the side surface of the second electrode part 122 with respect to the lower surface of the insulating layer 110. In addition, the first inclination of the side surface of the first electrode part 121 with respect to the upper surface of the insulating layer 110 may be different from the second inclination of the side surface of the second electrode part 122 with respect to the upper surface of the insulating layer 110.

Accordingly, the side surface of the through electrode 120 of the embodiment may include an inflection portion. For example, the side surface of the through electrode 120 may include an inflection portion formed at an boundary between the first electrode part 121 and the second electrode part 122.

Meanwhile, the first inclination of the first electrode part 121 is said to be perpendicular to the upper or lower surface of the insulating layer 110, but is not limited thereto. For example, the first inclination may have an angle close to vertical, for example, in a range between 85 degrees and 95 degrees.

However, the first inclination is closer to vertical than second inclination. Therefore, if the first inclination is vertical, a width of the upper surface and a width of the lower surface of the first electrode part 121 may be substantially the same. Additionally, if the first inclination has a certain difference in the vertical, the width of the upper surface and the width of the lower surface of the first electrode part 121 may have a first difference value. However, the first inclination of the first electrode part 121 is closer to vertical than the second inclination of the second electrode part 122, and accordingly, a second difference value between the width of the upper surface and the lower surface of the second electrode part 122 may be greater than the first difference value. For example, the first electrode part 121 may have little change in width from the lower surface to the upper surface, and the width of the second electrode part 122 may gradually increase from the lower surface to the upper surface.

Additionally, a width of a region with a smallest width in the second electrode part 122 may be the same as a width of the first electrode part 121. For example, a width of the lower surface of the second electrode part 122 may be the same as a width of the first electrode part 121 (for example, the width of the upper surface of the first electrode part or the width of the lower surface of the first electrode part).

Meanwhile, the first electrode part 121 and the second electrode part 122 of the through electrode 120 as described above may be formed to pass through each of the first region 111 and the second region 112 of the insulating layer 110.

For example, the insulating layer 110 may include a through hole TH in which the through electrode 120 is disposed.

Specifically, the first region 111 of the insulating layer 110 may include a first hole part TH1 of the through hole TH in which the first electrode part 121 is disposed. Additionally, the first hole part TH1 may have a shape corresponding to the first electrode part 121. For example, the first hole part TH1 is disposed adjacent to the lower surface of the insulating layer 110. In addition, the first hole part TH1 may be little change in width toward the upper surface of the insulating layer 110. For example, a vertical cross-section of the first hole part TH1 may have a square shape. For example, an inner wall of the first hole part TH1 may have a first inclination corresponding to the first through electrode 120, and the first inclination may be perpendicular to the lower or upper surface of the insulating layer 110.

Additionally, the second hole part TH2 may have a shape corresponding to the second electrode part 122. For example, the second hole part TH2 may be disposed adjacent to the upper surface of the insulating layer 110, and its width may gradually increase toward the upper surface of the insulating layer 110. For example, an inner wall of the second hole part TH2 may have an inclination corresponding to the second inclination of the second electrode part 122.

Accordingly, in an embodiment, the first electrode part 121 filled in the first hole part TH1 may have a rectangular shape in which the width of the upper surface and the width of the lower surface are equal to the first width W1. For example, the width of the upper surface of the first hole part TH1 or the first electrode part 121 may satisfy a range of 95% to 105% of the width of the lower surface of the first hole part TH1 or the first electrode part 121.

Additionally, the second electrode part 122 filled in the second hole part TH2 may have a trapezoidal shape with different upper and lower widths W2.

At least a portion of the glass fiber included in the second region 112 may protrude toward the second hole part TH3 during the process of forming the second hole part TH2. Additionally, the second electrode part 122 that fills the second hole part TH2 may be formed to cover the glass fiber protruding toward the second hole part TH2. At this time, the exposed glass fiber may function to increase the roughness of the inner wall of the through hole. Based on this, the embodiment can improve the adhesion between the insulating layer 110 and the through electrode 120.

Meanwhile, a first circuit pattern layer 130 is disposed on the lower surface of the insulating layer 110 in the embodiment, and a second circuit pattern layer 140 is disposed on the upper surface of the insulating layer 110. The first circuit pattern layer 130 and the second circuit pattern layer 140 may include at least one pad connected to the through electrode 120 and a trace connected to the pad. For example, the first circuit pattern layer 130 may include a first pad connected to the lower surface of the through electrode 120 (e.g., the lower surface of the first electrode part 121). For example, the second circuit pattern layer 140 may include a second pad connected to the upper surface of the through electrode 120 (e.g., the upper surface of the second electrode part 122).

The first pad of the first circuit pattern layer 130 may have a width greater than a width of the first electrode part 121. For example, the first pad of the first circuit pattern layer 130 may have a width greater than the width W1 of the lower surface of the first electrode part 121. Accordingly, the embodiment allows the first pad of the first circuit pattern layer 130 to be disposed to entirely cover the lower surface of the first electrode part 121, so that it is possible to improve the reliability of the function (e.g., signal transmission, heat dissipation, or shielding) of the first pad (e.g., signal transmission characteristics, heat dissipation characteristics, and shielding characteristics).

The second pad of the second circuit pattern layer 140 may have a width greater than a width of the second electrode part 122. For example, the second pad of the second circuit pattern layer 140 may have a width greater than the width W2 of the upper surface of the second electrode part 122. Accordingly, the embodiment allows the second pad of the second circuit pattern layer 140 to be disposed to entirely cover the upper surface of the second electrode part 122, so that it is possible to improve the reliability of the function (e.g., signal transmission, heat dissipation, or shielding) of the second pad (e.g., signal transmission characteristics, heat dissipation characteristics, and shielding characteristics).

The first circuit pattern layer 130 and the second circuit pattern layer 140 may be formed of at least one metal material selected from gold (Au), silver (Ag), platinum (Pt), titanium (Ti), tin (Sn), copper (Cu), and zinc (Zn).

In addition, the first circuit pattern layer 130 and the second circuit pattern layer 140 may be formed of a paste or solder paste including at least one metal material selected from gold (Au), silver (Ag), platinum (Pt), titanium (Ti), tin (Sn), copper (Cu), and zinc (Zn) having excellent bonding power. Preferably, the first circuit pattern layer 130 and the second circuit pattern layer 140 may be formed of copper (Cu) having high electrical conductivity and a relatively inexpensive price.

The first circuit pattern layer 130 and the second circuit pattern layer 140 can be formed by additive process, subtractive process, modified semi additive process (MSAP) and semi additive process (SAP) which is a typical circuit board manufacturing process, and detailed descriptions are omitted here.

Meanwhile, the first circuit pattern layer 130 does not overlap the through electrode 120 in the horizontal direction. For example, a portion of the first circuit pattern layer 130 overlaps the through electrode 120 in the vertical direction. Additionally, the first circuit pattern layer 130 does not include a portion that overlaps the through electrode 120 in the horizontal direction. That is, in the embodiment, the first electrode part 121 of the through electrode 120 may be formed to have a square vertical cross-section by using the first circuit pattern layer 130 as a dam. At this time, at least a portion of the first circuit pattern layer 130 may be disposed surrounding the side surface of the first electrode part 121. And, when the vertical cross-section of the first electrode part 121 is made to have a square shape using the first circuit pattern layer 130, a dry film stacking process, an exposure process, and a development process are repeatedly required to form a pattern that functions as a dam surrounding the first electrode part, and this can make the manufacturing process complicated. In contrast, the embodiment allows the vertical cross-section of the first electrode part 121 to have a square shape by using the physical properties of each region of the insulating layer 110, thereby simplifying the manufacturing process.

As described above, when forming the through electrode 120 in the insulating layer 110, the insulating layer 110 in an embodiment is divided into a plurality of regions, and electrode parts (e.g., first and third electrode parts) penetrating each region are formed accordingly. Accordingly, the embodiment can minimize the difference between the width of the upper surface and the lower surface of the through electrode 120, and enable miniaturization of the through electrode 120. Accordingly, the embodiment can improve the physical reliability and electrical reliability of the through electrode 120, which may occur as the width of the through electrode 120 increases. In addition, the embodiment can maintain the overall strength of the insulating layer 110 by densely clustering glass fibers in the second region 112 of the insulating layer 110, and allow the first electrode part 121 to be formed in the first region 111 with substantially equal widths of the upper and lower surfaces. Accordingly, the embodiment can minimize a difference between the width of the upper and lower surfaces of the through electrode compared to the through electrode whose overall shape is trapezoidal in the comparative example, so that it possible to miniaturize the through electrode. Furthermore, the embodiment can reduce the width of the upper surface of the through electrode 120 compared to the comparative example, and accordingly, the integration degree of the through electrode 120 and the second circuit pattern layer 140 can be improved.

Meanwhile, in a general circuit board, an insulating layer is formed using a photosensitive material to form a small via. For example, it is known that the insulating layer on a general circuit board forms a via by applying PID (Photo Imageable Dielectric), a photosensitive material, to implement a small via.

However, PID generally has a dielectric constant (Dk) exceeding 3.0, making it difficult to apply to 5G or higher substrates. For example, in a 5G board, the dielectric constant of the board must be low. However, the dielectric constant of general PID exceeds 3.0. Accordingly, when applying the PID to a 5G substrate, there is a problem that signal transmission loss increases when transmitting a large signal.

Additionally, if you implement a circuit board using PID, a sputter equipment for deposition must be used in the plating process for forming a circuit on a circuit board including the PID, and there is a problem that process costs increase due to this. Furthermore, the circuit board including the PID has a problem of low adhesion between the insulating layer composed of the PID and the circuit pattern, and accordingly, there is a problem that the circuit pattern is separated from the insulating layer. For example, the circuit board containing PID require a high process temperature (e.g., 250° C. or higher) during the circuit pattern formation process or soldering process, and the adhesion between PID and the circuit pattern is reduced due to such a high processing temperature, causing the circuit pattern to be separated from the insulating layer.

Accordingly, the embodiment uses prepreg to form the insulating layer 110.

At this time, the prepreg used as the insulating layer 110 in the embodiment may have a dielectric constant (Dk) between 2.0 and 3.0. If the dielectric constant of the insulating layer 111 is less than 2.0, there is a problem that the processability of the material is reduced. For example, if the dielectric constant of the insulating layer 111 is less than 2.0, there is a problem in that the warpage characteristics are deteriorated in the process of forming vias or circuit patterns due to the decrease in rigidity, and this causes a problem in that process characteristics is deteriorated. Additionally, if the dielectric constant (Dk) of the insulating layer 110 exceeds 3.0, there is a problem of increased signal loss.

Accordingly, the insulating layer 110 in the embodiment has a dielectric constant (Dk) between 2.0 and 3.0. For example, the insulating layer 110 in the embodiment may be formed of prepreg having a dielectric constant (Dk) between 2.0 and 3.0. Through this, the embodiment provides a circuit board with a low dielectric constant, allowing application to 5G products and solving the reliability problem of the PID.

For example, referring to (a) of FIG. 3B, the embodiment allows a first electrode part 121 having a substantially rectangular vertical cross-section to be formed in the first region 111 of the insulating layer 110, and allows a second electrode part 122 having a trapezoidal shape to be formed in the second region 112.

Accordingly, the embodiment allows the width of the lower surface of the through electrode 120 to have a first width W1 and the width of the upper surface to have a second width W2 that is smaller than the first width W1.

At this time, referring to (b) of FIG. 3B, in the comparative example, the through electrode 20 has only an inclination whose width increases from the upper surface to the lower surface.

Accordingly, when the width w2 of the upper surface of the through electrode 20 has the same width as the width W2 of the upper surface of the through electrode 120 of the present application, the width w1 of the lower surface of the through electrode 20 in the comparative example is larger than the width W1 of the lower surface of the through electrode 120 of the present application.

For example, the through electrode 20 in the comparative example has a width w1 greater than the width W1 of the lower surface of the through electrode in the present application by the first difference Δw, due to the inclination of the through electrode 20.

Accordingly, the difference between the width of the upper surface and the lower surface of the through electrode 20 in the comparative example is more than twice the first difference Δw compared to the through electrode 120 of the present application.

On the other hand, the embodiment can reduce the difference between the width of the upper and lower surfaces of the through electrode 120 compared to the comparative example, thereby enabling miniaturization of the through electrode.

Meanwhile, the circuit board of the embodiment may include a first protective layer 150 disposed on the lower surface of the insulating layer 110. The first protective layer 150 may include an opening OR1 that overlaps the first circuit pattern layer 130 in a vertical direction. The portion of the first circuit pattern layer 130 that overlaps the opening OR1 in the vertical direction can be used as a terminal pad where conductive connection parts (for example, solder balls) that are later connected to the main board are placed. The first protective layer 150 may be solder resist, but is not limited thereto.

The circuit board of the embodiment may include a second protective layer 160 disposed on the upper surface of the insulating layer 110. The second protective layer 160 may include an opening OR2 that overlaps the second circuit pattern layer 140 in a vertical direction. The portion of the second circuit pattern layer 140 that overlaps the opening OR2 in the vertical direction can be used as a mounting pad on which conductive connection parts (e.g., solder balls) on which the chip is later mounted are placed. The second protective layer 160 may be solder resist, but is not limited thereto.

FIG. 4 is a view for explaining inclination of a through electrode according to an embodiment.

Hereinafter, the inclination of the through electrode 120 will be described with reference to FIG. 4. At this time, the inclination of each inner wall of the first hole part TH1 and the second hole part TH2 where the first electrode part 121 and the second electrode part 122 are disposed may correspond to the first to third inclinations of the first electrode part 121, the second electrode part 122, and the third electrode part 123, respectively.

Hereinafter, an inclination of each side surface of the first electrode part 121 and the second electrode part 122 will be described with reference to FIG. 4.

The first and second inclinations on the side surfaces of the first electrode part 121 and the second electrode part 122 may be an inclination on the upper surface of the insulating layer 110, or alternatively, it may be an inclination on the lower surface.

As shown in (a) of FIG. 4, the side surface of the second electrode part 122 may have a second inclination with respect to the upper surface of the insulating layer 110. For example, an internal angle θ1 between the upper surface of the insulating layer 110 and the side surface of the second electrode part 122 having the second inclination may be an acute angle.

Alternatively, as shown in (b) of FIG. 4, the side surface of the second electrode part 122 may have a second inclination with respect to the lower surface of the insulating layer 110. For example, an internal angle θ2 between the lower surface of the insulating layer 110 and the side surface of the second electrode part 122 having the second inclination may be an obtuse angle.

Meanwhile, as shown in (c) of FIG. 4, the side surface of the first electrode part 121 may have a first inclination with respect to the upper or lower surface of the insulating layer 110. For example, an internal angle θ3 between the upper surface of the insulating layer 110 and the side surface of the first electrode part 121 having the first inclination may be a right angle. However, the embodiment is not limited to this, and the internal angle θ3 between the upper surface of the insulating layer 110 and the side surface of the first electrode part 121 having the first inclination can have in a range between 85 degrees and 95 degrees.

For example, the internal angle θ4 between the lower surface of the insulating layer 110 and the side surface of the first electrode part 121 having the first inclination may be a right angle. However, the embodiment is not limited to this, and the internal angle θ4 between the lower surface of the insulating layer 110 and the side surface of the first electrode part 121 having the first inclination can have in a range between 85 degrees and 95 degrees.

The embodiment includes an insulating layer. In addition, the insulating layer may be divided into a first region and a second region in a thickness direction. At this time, the embodiment includes a glass fiber-dense region in the second region of the insulating layer. In addition, the embodiment allows forming a through hole in the insulating layer including the dense region and filling the formed through hole with a conductive material to form a through electrode. Accordingly, the embodiment allows the through hole and the through electrode formed to fill the through hole to have different inclinations in the first region and the second region. For example, the embodiment allows a first hole part of a through hole or a first electrode part of a through electrode to be formed in the first region with little change in width, and allows the second hole part of a through hole or the second electrode part of a through electrode to have a second inclination whose width gradually decreases towards an upper portion in the second region. At this time, the embodiment may have a vertical cross-section having a square shape in a region adjacent to the lower surface with a relatively large width among the upper and lower surfaces of the through electrode. Accordingly, the embodiment can reduce the difference between the width of the upper and lower surfaces of the through electrode compared to the comparative example. Furthermore, the embodiment can reduce the difference between the width of the upper and lower surfaces of the through electrode, thereby reducing an overall size of the through electrode and further improving the circuit integration of the circuit board.

Furthermore, the embodiment allows the second region of the insulating layer to include a dense region of glass fibers, and thus the glass fibers may be partially exposed in the second hole part of the through hole. Additionally, the through electrode in the embodiment may be formed to cover the glass fiber exposed through the through hole. At this time, the exposed glass fibers function to increase a roughness of an inner wall of the through hole, and accordingly, when forming the through electrode, the adhesion between the insulating layer and the through electrode can be improved. Accordingly, the embodiment can solve the problem of the through electrode being separated from the insulating layer due to warpage that occurs in various usage environments of the circuit board. Accordingly, the physical and electrical reliability of the circuit board can be improved.

FIG. 5 is a view illustrating a circuit board according to a second embodiment.

The circuit board of FIG. 5 is characterized in that the circuit board of FIG. 3A has a multi-layer structure.

For example, a circuit board may have a three-layer structure based on the number of insulating layers. However, the embodiment is not limited to this, and the circuit board may have a two-layer structure, and alternatively, may have four or more layers.

Additionally, a circuit board with a multi-layer structure may have a structure in which the circuit board in FIG. 3A is made of multiple layers.

For example, the insulating layer of the circuit board may include a first insulating layer 211, a second insulating layer 212, and a third insulating layer 213.

For example, the circuit pattern layer of the circuit board may include a first circuit pattern layer 231, a second circuit pattern layer 241, a third circuit pattern layer 251, and a fourth circuit pattern layer 261.

For example, the through electrode of the circuit board may include a first through electrode 221, a second through electrode 222, and a third through electrode 223.

At this time, the first through electrode 221, the second through electrode 222, and the third through electrode 223 may have a shape and structure corresponding to the through electrode 120 in FIG. 2A.

Additionally, the protective layer of the circuit board may include a first protective layer 271 and a second protective layer 281.

Meanwhile, the circuit board in FIG. 5 shows an example of a coreless board and an ETS structure.

Alternatively, the circuit board may be a core board. For example, a circuit board may include a core layer.

FIG. 6 is a view illustrating a circuit board according to a third embodiment.

Referring to FIG. 6, the circuit board may include a core layer 312. In addition, the circuit board may include a first insulating layer 311 formed on the core layer 312 and a second insulating layer 313 disposed under the core layer 312.

Additionally, the circuit pattern layer of the circuit board includes a first circuit pattern layer 331, a second circuit pattern layer 341, a third circuit pattern layer 351, and a fourth circuit pattern layer 361.

Additionally, the through electrode of the circuit board may include a first through electrode 321, a second through electrode 322, and a third through electrode 323.

At this time, the second through electrode 322 is a through electrode formed in the core layer 312, and accordingly may have a different shape from the first through electrode 321 and the third through electrode 323. For example, the second through electrode 322 may have an hourglass shape.

Alternatively, the first through electrode 311 and the third through electrode 323 may have a shape and structure corresponding to the through electrode 120 in FIG. 3A.

For example, substantially, the third through electrode 323 may have a shape corresponding to the through electrode 120 of FIG. 3A. Additionally, the first through electrode 321 may have a shape that is symmetrical to the third through electrode 323 with respect to the core layer 312.

Additionally, the protective layer of the circuit board may include a first protective layer 371 and a second protective layer 381.

FIG. 7 is a view illustrating a package substrate according to an embodiment.

Referring to FIG. 7, the package substrate of the embodiment includes the circuit board of FIG. 5, at least one chip mounted on the circuit board, a molding layer for molding the chip, and a connection part for connecting the chip or an external substrate. However, the package substrate may be formed by mounting a chip on the circuit board of FIG. 3A or the circuit board of FIG. 6. For example, the package substrate may represent a part of a semiconductor package in an embodiment.

For example, the package substrate of the embodiment may include a first connection part 410 disposed on the first pattern layer 241, which is the uppermost pattern layer. A cross section of the first connection part 410 may include a circular shape or a semicircular shape. For example, the cross section of the first connection part 410 may include a partially or entirely rounded shape. The cross-sectional shape of the first connection part 410 may be flat on one side and curved on the other side. The first connection part 410 may be a solder ball, but is not limited thereto.

Meanwhile, the embodiment may include a chip 420 disposed on the first connection part 410. The chip 420 may be a processor chip. For example, the chip 420 may be an application processor (AP) chip among a central processor (e.g., CPU), a graphics processor (e.g., GPU), a digital signal processor, a cryptographic processor, a microprocessor, or a microcontroller. The terminal 425 of the chip 420 may be connected to the first pattern layer 241 through the first connection part 410. For example, the first pattern layer 241 may include a mounting pad on which the chip 220 is mounted.

In addition, although not shown in the drawing, the package substrate of the embodiment may further include an additional chip. For example, the embodiment may allow at least two chips among a central processor (e.g., CPU), a graphics processor (e.g., GPU), a digital signal processor, a cryptographic processor, a microprocessor, or a microcontroller to be respectively disposed at a regular distance on the circuit board. For example, the chip 420 in the embodiment may include a central processor chip and a graphics processor chip, but is not limited thereto.

Meanwhile, the plurality of chips may be spaced apart from each other at a predetermined distance on the circuit board. For example, the distance between the plurality of chips may be 150 μm or less. For example, the distance between the plurality of chips may be 120 μm or less. For example, the distance between the plurality of chips may be 100 μm or less.

Preferably, the distance between the plurality of chips may range from 60 μm to 150 μm. Preferably, the distance between the plurality of chips may range from 70 μm to 120 μm. Preferably, the distance between the plurality of chips may range from 80 μm to 110 μm. If the distance between the plurality of chips is less than 60 μm, problems with operation reliability may occur due to mutual interference between the plurality of chips. If the distance between the plurality of chips is greater than 150 μm, signal transmission loss may increase as the distance between the plurality of chips increases. If the distance between the plurality of chips is greater than 150 μm, the volume of the package substrate may increase.

The package substrate may include a molding layer 430. The molding layer 430 may be disposed to cover the chip 420. For example, the molding layer 430 may be EMC (Epoxy Mold Compound) formed to protect the mounted chip 420, but is not limited thereto.

At this time, the molding layer 430 may have a low dielectric constant to increase heat dissipation characteristics. For example, the dielectric constant (Dk) of the molding layer 430 may be 0.2 to 10. For example, the dielectric constant (Dk) of the molding layer 430 may be 0.5 to 8. For example, the dielectric constant (Dk) of the molding layer 430 may be 0.8 to 5. Accordingly, in the embodiment, the molding layer 430 has a low dielectric constant to improve heat dissipation characteristics for heat generated from the chip 420.

Meanwhile, the package substrate may include a second connection part 440 disposed at a lowermost side of the circuit board. The second connection part 440 may be disposed on the lower surface of the fourth pattern layer 261 exposed through the first protective layer 281.

Manufacturing Method

Hereinafter, a method of manufacturing the circuit board shown in FIG. 3A according to an embodiment will be described in process order.

FIGS. 8A and 8J are views showing a method for manufacturing a circuit board shown in FIG. 3A in order of processes.

Referring to FIG. 8A, in the embodiment, a carrier board that is the basis for manufacturing a circuit board is prepared. The carrier board may be a basic material for manufacturing a circuit board using the ETS method.

For example, in an embodiment, a carrier board having a carrier insulating layer 510 and a metal layer 520 disposed on at least one surface of the carrier insulating layer 510 may be prepared. At this time, the metal layer 520 may be disposed on only one of the first surface and the second surface of the carrier insulating layer 510, or alternatively, it may be disposed on both surfaces. For example, the metal layer 520 is disposed only on one side of the carrier insulating layer 510, and accordingly, the ETS process for manufacturing a circuit board can be performed only on this one side. Alternatively, the metal layer 520 can be disposed on both sides of the carrier insulating layer 510, and thus the ETS process for manufacturing a circuit board can be performed simultaneously on both sides of the carrier board. In this case, two circuit boards can be manufactured at once.

The metal layer 520 may be formed by electroless plating on the carrier insulating layer 510. Alternatively, the carrier insulating layer 520 and the metal layer 510 may be CCL (Copper Clad Laminate).

Additionally, in an embodiment, a plating layer 530, which is a separation layer for easy separation of the substrate and carrier board in the future and a seed layer used when forming a circuit board, may be formed on the metal layer 520. The plating layer 530 may be formed on the metal layer 520 through electroless plating, or alternatively, it may be formed through a sputtering process.

Next, as shown in FIG. 8B, the embodiment proceeds with forming a first dry film DF1 on the lower surface of the plating layer 530. At this time, the first dry film DF1 may include an open region. For example, the first dry film DF1 may include an open region on the lower surface of the plating layer 530 that overlaps in the vertical direction with a region where the second circuit pattern layer 140 will be formed.

Next, as shown in FIG. 8C, the embodiment proceeds with a process of forming a second circuit pattern layer 140 that fills the open region of the first dry film DF1 by performing electrolytic plating with the plating layer 530 as a seed layer, Then, when the second circuit pattern layer 140 is formed, the embodiment can proceed with a process of removing the first dry film DF1.

Next, as shown in FIG. 8D, an insulating layer 110 covering the second circuit pattern layer 140 is formed on the lower surface of the plating layer 530. The insulating layer 110 is divided into a first region 111 and a second region 112, and accordingly, it may include glass fibers 112a concentrated in the second region 112. Additionally, a copper foil layer 540 may be formed on the lower surface of the insulating layer 110. The copper foil layer 540 may be formed on the lower surface of the insulating layer 110 to maintain the flatness of the insulating layer 110 when the insulating layer 110 is laminated.

Next, as shown in FIG. 8E, the embodiment may proceed with a process of forming a first film layer 550 on the lower surface of the copper foil layer 540, and a process of forming a second film layer 560 on the lower surface of the first film layer 550.

The first film layer 550 may be a dry film.

Additionally, the second film layer 550 may be a PET (polyethylene terephthalate) film or an OPP (Oriented Polypropylene) film.

Rather than radiating a laser beam directly onto the copper foil layer 540 to form a through hole (VH) penetrating the insulating layer 110, the embodiment can perform a laser process for forming a through hole (VH) after forming the first film layer 550 and the second film layer 560 on the copper foil layer 540.

The first film layer 550 and the second film layer 560 prevent the laser beam from being focused on the first region 111 of the insulating layer 110, and accordingly, the width of the through hole in the first region 111 of the insulating layer 110 can be prevented from expanding. At this time, in the embodiment, the through-hole forming process is performed after including both the first film layer 550 and the second film layer 560. However, the present invention is not limited to this, and the embodiment may proceed with a process of forming the through after forming only one of the film layers.

Next, as shown in FIG. 8F, the embodiment may proceed with a process of forming a through hole (VH) in the insulating layer 110.

For example, the embodiment can proceed with the process of forming a through hole (VH) penetrating the first film layer 550, the second film layer 560, the copper foil layer 540, and the insulating layer 110 by irradiating a laser beam from the lower side of the insulating layer 110.

At this time, the insulating layer 110 includes a first hole part VH1 formed in the first region 111 and including a side wall with a first inclination corresponding to a right angle, and a second hole part VH2 formed in the second region 112 and having a second inclination different from the first inclination, and whose width gradually decreases toward an upper side.

Next, as shown in FIG. 8G, the embodiment may proceed with a process of removing the first film layer 550 and the second film layer 560.

Next, as shown in FIG. 8H, the embodiment may proceed with a process of forming a through electrode 120 that fills the through hole VH and a process of forming a first circuit pattern layer 130 connected to the through electrode 120 on the lower surface of the insulating layer 110.

Next, as shown in FIG. 8I, the circuit board and the carrier board can be separated around the interface between the plating layer 530 and the metal layer 520.

Next, as shown in FIG. 8J, the embodiment may proceed with a process of removing the plating layer 530 by etching and a process of forming the first protective layer 150 and the second protective layer 160 on the insulating layer 110.

The embodiment includes an insulating layer. In addition, the insulating layer may be divided into a first region and a second region in a thickness direction. At this time, the embodiment includes a glass fiber-dense region in the second region of the insulating layer. In addition, the embodiment allows forming a through hole in the insulating layer including the dense region and filling the formed through hole with a conductive material to form a through electrode. Accordingly, the embodiment allows the through hole and the through electrode formed to fill the through hole to have different inclinations in the first region and the second region. For example, the embodiment allows a first hole part of a through hole or a first electrode part of a through electrode to be formed in the first region with little change in width, and allows the second hole part of a through hole or the second electrode part of a through electrode to have a second inclination whose width gradually decreases towards an upper portion in the second region. At this time, the embodiment may have a vertical cross-section having a square shape in a region adjacent to the lower surface with a relatively large width among the upper and lower surfaces of the through electrode. Accordingly, the embodiment can reduce the difference between the width of the upper and lower surfaces of the through electrode compared to the comparative example. Furthermore, the embodiment can reduce the difference between the width of the upper and lower surfaces of the through electrode, thereby reducing an overall size of the through electrode and further improving the circuit integration of the circuit board.

Furthermore, the embodiment allows the second region of the insulating layer to include a dense region of glass fibers, and thus the glass fibers may be partially exposed in the second hole part of the through hole. Additionally, the through electrode in the embodiment may be formed to cover the glass fiber exposed through the through hole. At this time, the exposed glass fibers function to increase a roughness of an inner wall of the through hole, and accordingly, when forming the through electrode, the adhesion between the insulating layer and the through electrode can be improved. Accordingly, the embodiment can solve the problem of the through electrode being separated from the insulating layer due to warpage that occurs in various usage environments of the circuit board. Accordingly, the physical and electrical reliability of the circuit board can be improved.

Features, structures, effects, etc. described in the above embodiments are included in at least one embodiment, and it is not necessarily limited to only one embodiment. Furthermore, features, structures, effects, etc. illustrated in each embodiment can be combined or modified for other embodiments by those of ordinary skill in the art to which the embodiments belong. Accordingly, the contents related to such combinations and variations should be interpreted as being included in the scope of the embodiments.

In the above, the embodiment has been mainly described, but this is only an example and does not limit the embodiment, and those of ordinary skill in the art to which the embodiment pertains will appreciate that various modifications and applications not illustrated above are possible without departing from the essential characteristics of the present embodiment. For example, each component specifically shown in the embodiment can be implemented by modification. And the differences related to these modifications and applications should be interpreted as being included in the scope of the embodiments set forth in the appended claims.

What is claimed is:

1. A circuit board comprising:
   a first insulating layer including an upper and lower surface and a reinforcing member;
   a first through electrode passing through the upper and lower surfaces of the first insulating layer; and
   a first circuit pattern layer disposed on a lower surface of the first insulating layer,
   wherein the first through electrode includes:
   a first electrode part disposed adjacent to the lower surface of the first insulating layer and having a first inclination; and
   a second electrode part disposed adjacent to the upper surface of the first insulating layer and having a second inclination that is different from the first inclination so that a width gradually decreases toward the upper surface of the first insulating layer,
   wherein the first inclination of the first electrode part non-overlaps in a horizontal direction with the first circuit pattern layer and the reinforcing member,
   wherein the second inclination of the first electrode part contacts the reinforcing member,
   wherein a thickness of the first electrode part is thinner than a thickness of the second electrode part,
   wherein a width of an upper surface of the first electrode part satisfies a range between 95% and 105% of a width of a lower surface of the first electrode part,
   wherein the first insulating layer includes a first region where the first electrode part is disposed and a second region where the second electrode part is disposed,
   wherein a content of the reinforcing member in the second region is different from a content of the reinforcing member in the first region,
   wherein at least a portion of the reinforcing member disposed in the second region protrudes toward a through hole passing through the first insulating layer, and
   wherein at least a portion of the protruded reinforcing member is disposed within the second electrode part.

2. The circuit board of claim 1, further comprising:
   a second insulating layer disposed on the first insulating layer; and
   a second through electrode passing through upper and lower surfaces of the second insulating layer,
   wherein the second through electrode includes:
   a third electrode part disposed adjacent to the lower surface of the second insulating layer and having a third inclination different from the first inclination and the second inclination so that a width gradually increases toward the upper surface of the second insulating layer; and a fourth electrode part disposed adjacent to the upper surface of the second insulating layer and includes having a fourth inclination corresponding to the first inclination.

3. The circuit board of claim 2, wherein the second insulating layer includes a reinforcing member, and wherein the third inclination of the second through electrode is in contact with the reinforcing member of the second insulating layer.

4. The circuit board of claim 2, wherein a vertical length of the third inclination is greater than a vertical length of the fourth inclination.

5. The circuit board of claim 2, wherein the second electrode part has a symmetrical shape with the third electrode part based on the upper surface of the first insulating layer or the lower surface of the second insulating layer.

6. The circuit board of claim 2, further comprising:

a third insulating layer disposed between the first insulating layer and the second insulating layer; and a third through electrode passing through the third insulating layer, wherein the third through electrode includes:

a fifth electrode part disposed adjacent to a lower surface of the third insulating layer and having a fifth inclination so that a width gradually decreases toward an upper surface of the third insulating layer; and a sixth electrode part disposed adjacent to the upper surface of the third insulating layer and having a sixth inclination so that a width gradually increases toward the upper surface of the third insulating layer.

7. The circuit board of claim 1, wherein the reinforcing member is not disposed in the first region.

8. The circuit board of claim 7, wherein the content of the reinforcing member in the second region is greater than the content of the reinforcing member in the first region.

9. The circuit board of claim 1, wherein an interior angle between the lower surface of the first insulating layer and the first inclination is smaller than an interior angle between the lower surface of the first insulating layer and the second inclination.

10. The circuit board of claim 1, wherein the reinforcing member is closer to the upper surface of the first insulating layer than to the lower surface of the first insulating layer within the first insulating layer.

11. The circuit board of claim 10, wherein a width of a region with a smallest width in the second electrode part is same as a width of an upper surface of the first electrode part or a lower surface of the first electrode part.

12. The circuit board of claim 1, wherein the first inclination is perpendicular to the upper or lower surface of the first insulating layer.

13. The circuit board of claim 1, further comprising:

a second circuit pattern layer buried in the first insulating layer and connected to an upper surface of the second electrode part.

14. The circuit board of claim 1, wherein the reinforcing member includes glass fiber.

15. A circuit board comprising:

a core layer;

a build-up insulating layer disposed on the core layer;

a first through electrode passing through the core layer; and a second through electrode passing through the build-up insulating layer, wherein the first through electrode includes:

a first through part disposed adjacent to an upper surface of the core layer and having a first inclination whose width gradually decreases toward a lower surface of the core layer; and a second through part disposed adjacent to the lower surface of the core layer and having a second inclination whose width gradually decreases toward the upper surface of the core layer, wherein the second through electrode includes:

a third through part adjacent to a lower surface of the build-up insulating layer and having a third inclination such that the width gradually increases toward an upper surface of the build-up insulating layer; and a fourth through part disposed adjacent to the upper surface of the build-up insulating layer and having a fourth inclination different from the first to third inclinations, and wherein the build-up insulating layer includes a reinforcing member, wherein the third inclination of the third through part is in contact with the reinforcing member, and wherein a vertical length of the third inclination is greater than a vertical length of the fourth inclination.

16. The circuit board of claim 15, wherein the fourth inclination has an angle closer to 90 degrees than angles of the first to third inclinations.

17. The circuit board of claim 15, further comprising:

a lower build-up layer disposed under the lower surface of the core layer; and a third through electrode passing through the lower build-up layer, and wherein the third through electrode has a symmetrical shape with the second through electrode with respect to the core layer.

18. A circuit board comprising:

a plurality of insulating layers sequentially stacked along a vertical direction; and a plurality of through electrodes each disposed within the plurality of insulating layers, wherein the plurality of through electrodes has the same inclination, wherein each of the plurality of through electrodes includes:

a first through part disposed adjacent to a lower surface of each insulating layer and having a first inclination; and a second through part disposed closer to an upper surface of each insulating layer than the first through part and having a second inclination different from the first inclination such that the width gradually decreases toward the upper surface of each insulating layer, wherein the second inclination is in contact with a reinforcing member provided in each insulating layer, wherein a vertical length of the first inclination is greater than a vertical length of the second inclination, wherein each of the plurality of insulating layers includes a first region where the first through part is disposed and a second region where the second through part is disposed, wherein a content of the reinforcing member in the second region of each of the plurality of insulating layers is different from a content of the reinforcing member in the first region of each of the plurality of insulating layers,

wherein at least a portion of the reinforcing member
disposed in the second region of each of the plurality of
insulating layers protrudes toward a through hole pass-
ing through of each of the plurality of insulating layers,
and wherein at least a portion of the protruded reinforcing
member is disposed within the second through part of
each of the plurality of through electrodes.

19. The circuit board of claim 18, wherein the first
through part of each of the plurality of through electrodes
does not overlap the reinforcing member along a horizontal
direction.

* * * * *